United States Patent
Ohba et al.

(10) Patent No.: US 9,543,512 B2
(45) Date of Patent: Jan. 10, 2017

(54) SWITCH DEVICE AND STORAGE UNIT

(71) Applicant: Sony Semiconductor Solutions Corporation, Kanagawa (JP)

(72) Inventors: Kazuhiro Ohba, Tokyo (JP); Hiroaki Sei, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 14/590,014

(22) Filed: Jan. 6, 2015

(65) Prior Publication Data

US 2015/0207066 A1   Jul. 23, 2015

(30) Foreign Application Priority Data

Jan. 17, 2014   (JP) ................................ 2014-007265

(51) Int. Cl.
*H01L 45/00* (2006.01)
*H01L 27/24* (2006.01)

(52) U.S. Cl.
CPC ......... *H01L 45/144* (2013.01); *H01L 27/2427* (2013.01); *H01L 45/04* (2013.01); *H01L 45/1233* (2013.01); *H01L 45/142* (2013.01); *H01L 45/143* (2013.01)

(58) Field of Classification Search
CPC ...... H01L 45/06; H01L 45/142; H01L 45/143; H01L 45/144; H01L 45/146
See application file for complete search history.

(56) References Cited

U.S. PATENT DOCUMENTS

| | | | |
|---|---|---|---|
| 7,646,630 B2* | 1/2010 | Lowrey | G11C 13/0004 |
| | | | 326/39 |
| 7,983,065 B2* | 7/2011 | Samachisa | B82Y 10/00 |
| | | | 365/130 |
| 9,287,498 B2* | 3/2016 | Kau | H01L 45/16 |
| 2016/0064666 A1* | 3/2016 | Chan | H01L 45/145 |
| | | | 257/4 |

FOREIGN PATENT DOCUMENTS

| JP | 2006-086526 A | 3/2006 |
|---|---|---|
| JP | 2010-157316 A | 7/2010 |

OTHER PUBLICATIONS

Kim, Seonghyun et al., "Ultrathin (<10nm) $Nb_2O_5/NbO_2$ Hybrid Memory with Both Memory and Selector Characteristics for High Density 3D Vertically Stackable RRAM Applications," 2012 Symposium on VLSI Technology Digest of Technical Paper, pp. 155-156.

(Continued)

*Primary Examiner* — Mark Prenty
(74) *Attorney, Agent, or Firm* — Michael Best & Friedrich LLP

(57) ABSTRACT

A switch device includes: a first electrode; a second electrode arranged to face the first electrode; and a switch layer provided between the first electrode and the second electrode. The switch layer includes a first layer containing a chalcogen element, and a second layer containing a high resistance material.

19 Claims, 20 Drawing Sheets

(56) References Cited

OTHER PUBLICATIONS

Lee, Wootae et al., "Varistor-type Bidirectional Switch ($J_{MAX}$>$10^7$ A/cm$^2$, Selectivity~$10^4$) for 3D Bipolar Resistive Memory Arrays," 2012 Symposium on VLSI Technology Digest of Technical Paper, pp. 37-38.
Son, Myungwoo et al., "Excellent Selector Characteristics of Nanoscale $VO_2$ for High-Density Bipolar ReRAM Applications, IEEE Electron Device Letters," vol. 32, No. 11 Nov. 2011, pp. 1579-1581.
Huang, Jiun-Jia et al., "One Selector-One Resistor (1S1R) Crossbar Array for High-density Flexible Memory Applications," Department of Electronics Engineering and Institute of Electronics, National Chiao Tung University, Hsinchu, Taiwan, 2011, IEEE, pp. IED M11—733-736.

* cited by examiner

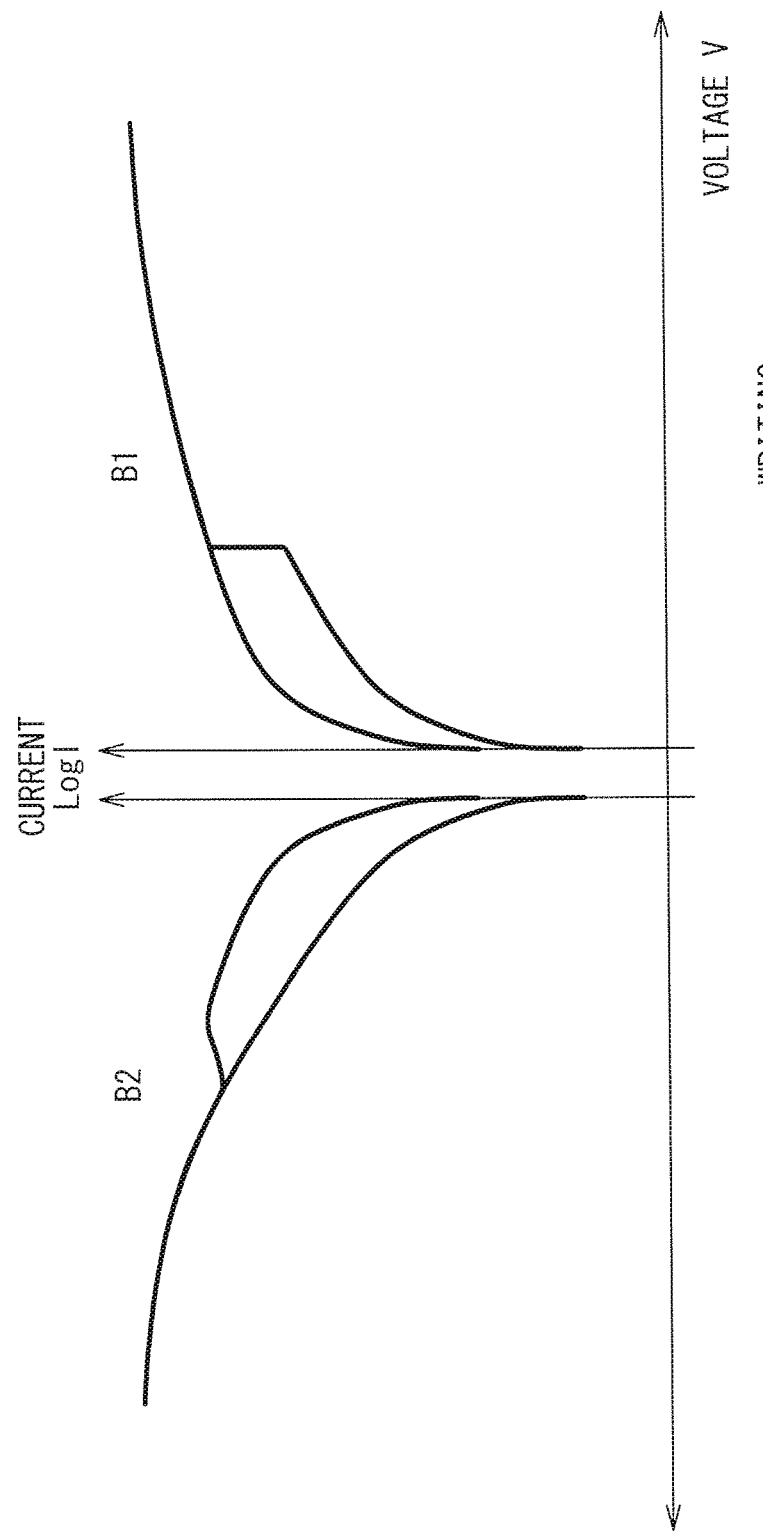

(SAMPLE 3)

(SAMPLE 4)

(SAMPLE 5)

SWITCH DEVICE AND STORAGE UNIT

CROSS REFERENCE TO RELATED APPLICATION

This application claims the benefit of Japanese Priority Patent Application JP 2014-007265 filed Jan. 17, 2014, the entire contents of which are incorporated herein by reference.

BACKGROUND

The present disclosure relates to a switch device that includes a chalcogenide layer between electrodes and to a storage unit that includes the switch device.

Recently, it has been demanded to increase capacity of a non-volatile memory for data storage which is typified by a resistance-variation-type memory such as a ReRAM (Resistance Random Access Memory) and a PRAM (Phase-change Random Access Memory). However, in a resistance-variation-type memory using a currently-available access transistor, the floor area per unit cell is large. For this reason, for example, when compared to a flash memory such as that of a NAND type, it has been difficult to increase capacity even the memory is miniaturized based on the same design rule. In contrast, when a so-called cross point array structure in which memory devices are arranged at intersections (cross points) of intersecting wirings is adopted, the floor area per unit cell is reduced, which makes it possible to achieve increase in capacity.

In a cross-point-type memory cell, a switch device for cell selection is provided other than the memory device. Examples of the switch device may include a switch device configured of metal oxide (for example, see Jiun-Jia Huang et al., 2011 IEEE IEDM11-733~736 and Wootae Lee et al., 2012 IEEE VLSI Technology symposium p. 37~38). However, magnitude of a switching threshold voltage of such a switch device is insufficient, and dielectric breakdown may be easily caused upon high voltage application. Other than this, examples of the switch device may include a switch device in which switching is performed at a certain switching threshold voltage and a current is thereby radically increased (Snap Back) (for example, see Myungwoo Son et al., IEEE ELECTRON DEVICE LETTERS, VOL. 32, NO. 11, NOVEMBER 2011, and Seonghyun Kim et al., 2012 VLSI p. 155~156). In such a switch device, by setting voltage values of selection and non-selection with the switching threshold voltage in between, it is easier to increase a selection current value than in a switch device made of a non-linear resistance material such as metal oxide. It is to be noted that the switching threshold voltage of the above-described switch device may be desirably a voltage that is higher than a write threshold voltage of a memory device to be used in combination. However, the switching threshold voltage of the above-described switch device has not been sufficiently high. Also, when the switch device is used in combination with a storage device having a high write threshold voltage, it is desired to secure a sufficiently-large selection ratio (ON-OFF ratio) between a selected (ON) state and a half-selected (OFF) state in the switch device, which has not been sufficient.

Other than the above-described switch device, for example, a switch device (an ovonic threshold switch (OTS, for example, see Japanese Unexamined Patent Application Publication Nos. 2006-86526 and 2010-157316) using a chalcogenide material, a PN diode, etc. may be mentioned.

SUMMARY

When using an OTS device in a cross-point-type memory cell, a larger ON-OFF ratio may be necessary. As a method of achieving a larger ON-OFF ratio, it may be an option to increase a thickness of a layer (a chalcogenide layer) configured of chalcogenide (for example, from about 100 nm to about several thousand nm). However, increase in thickness makes it difficult to miniaturize the memory cell, which may be an issue when capacity thereof is increased. Further, a switching threshold voltage is not sufficiently high, which is insufficient to allow a resistance-variation-type memory device to operate for which a relatively-high write threshold voltage is necessary.

On the other hand, a PN diode that is fabricated by epitaxial growth of silicon from a silicon substrate has a larger ON-OFF ratio, and also has a threshold voltage that is allowed to be increased by design. However, it is difficult to make the PN diode to have multiple layers to increase capacity. Also, the PN diode is basically a unidirectional diode. For this reason, it has not been possible to allow a memory cell to operate that is driven by a bidirectional voltage such as ReRAM, MRAM, and STTRAM (Spin Transfer Torque RAM).

Some devices such as an avalanche breakdown diode are capable of performing a bidirectional operation. However, such a device has not had sufficient characteristics as a switch device applied to a rewritable memory device in terms of balance between a leakage current in an OFF state and an ON-OFF ratio.

It is desirable to provide a switch device and a storage unit that have a larger ON-OFF ratio and a higher switching threshold voltage.

According to an embodiment of the present technology, there is provided a switch device including a first electrode, a second electrode arranged to face the first electrode, and a switch layer provided between the first electrode and the second electrode. The switch layer includes a first layer containing a chalcogen element, and a second layer containing a high resistance material.

According to an embodiment of the present technology, there is provided a storage unit including a plurality of memory cells each including a storage device and a switch device configured to be connected to the storage device. The switch device includes a first electrode, a second electrode arranged to face the first electrode, and a switch layer provided between the first electrode and the second electrode. The switch layer includes a first layer containing a chalcogen element, and a second layer containing a high resistance material.

In the switch device and the storage unit according to the embodiments of the present technology, the switch layer provided between the first electrode and the second electrode is configured of a laminated structure of the first layer containing the chalcogen element and the second layer containing the high resistance material. Accordingly, it is possible to control an operation region of the switch layer.

According to the switch device and the storage unit according to the embodiments of the present technology, the switch layer is configured of the laminated structure of the first layer containing the chalcogen element and the second layer containing the high resistance material, and the operation region of the switch layer is therefore controlled. This makes it possible to increase an ON-OFF ratio and a switching threshold voltage. Accordingly, it is possible to provide a storage unit that has high density and large capacity. It is to be noted that effects of the present technology are not necessarily limited to the effects described above and may be any of effects described herein.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

FIG. 11B is a diagram illustrating IV characteristics of the memory cell (a storage device) illustrated in FIG. 8.

BRIEF DESCRIPTION OF THE DRAWINGS

An embodiment of the present disclosure is described below in the following order with reference to the drawings.
1. Embodiment (An example in which a switch layer has a laminated structure of an OTS layer and a high resistance layer)
   1-1. Switch Device
   1-2. Storage Unit
2. Examples

[1. Embodiment]

[1-1. Switch Device]

Figure 1:
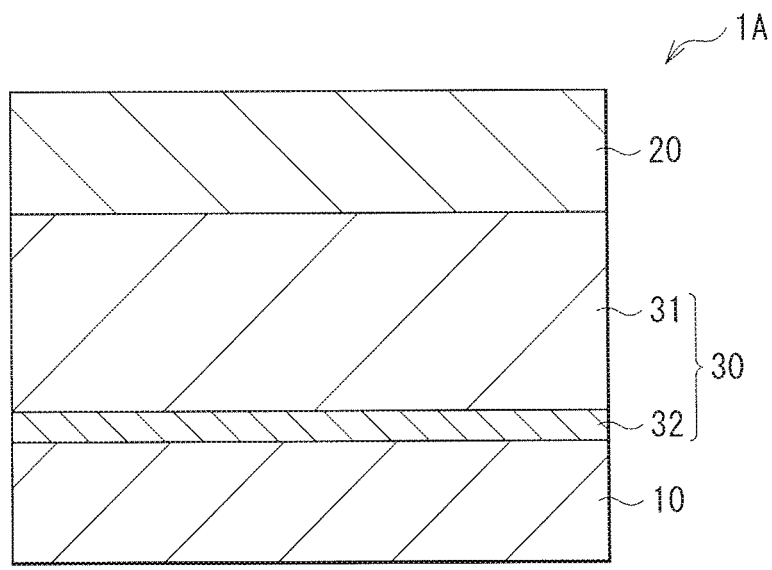
FIG. 1 is a cross-sectional diagram illustrating an example of a configuration of a switch device according to an embodiment of the present disclosure.

FIG. 1 illustrates a cross-sectional configuration of a switch device 1A according to an embodiment of the present disclosure. The switch device 1A may be, for example, for selectively causing an arbitrary storage device (a storage device 3Y illustrated in FIG. 8) to operate out of a plurality of storage devices provided in a memory cell array 2 that has a so-called cross point array structure illustrated in FIG. 8. The switch device 1A (a switch device 3X illustrated in FIG. 8) is connected in series to the storage device 3Y (specifically, a storage layer 40). The switch device 1A includes a bottom electrode 10 (a specific but not limitative example of "first electrode"), a switch layer 30, and a top electrode 20 (a specific but not limitative example of "second electrode") in order.

The bottom electrode 10 may be made of a wiring material used for a semiconductor process. Examples of such a wiring material may include tungsten (W), tungsten nitride (WN), titanium nitride (TiN), copper (Cu), aluminum (Al), molybdenum (Mo), tantalum (Ta), tantalum nitride (TaN), and silicide. When the bottom electrode 10 is made of a material, such as Cu, that may cause ion conduction under an electric field, a surface of the bottom electrode 10 made of the material such as Cu may be covered with a material that is less likely to cause ion conduction, heat diffusion, etc. such as W, WN, titanium nitride (TiN), and TaN.

The switch layer 30 may have, for example, a configuration in which a high resistance layer 32 (a specific but not limitative example of "second layer") and an OTS layer 31 (a specific but not limitative example of "first layer") are laminated in order from the bottom electrode 10 side.

The OTS layer 31 includes at least a Group 16 element in periodic table. Specific examples of the Group 16 element may include chalcogen elements such as oxygen (O), sulfur (S), selenium (Se), and tellurium (Te). The OTS layer 31 is provided in contact with the top electrode 20. Other than the above-mentioned chalcogen elements, the OTS layer 31 may preferably contain elements such as germanium (Ge), antimony (Sb), silicon (Si), and arsenic (As). Specifically, the OTS layer 31 may be made, for example, of chalcogenide such as GeTe, GeSbTe, SiAsTe, GeSe, GeSbSe, SiAsSe, GeS, GeSbS, or SiAsS. Alternatively, oxygen (O), nitrogen (N), etc. may be added thereto.

The OTS layer 31 may contain a metal element such as Al, magnesium (Mg), boron (B), yttrium (Y), and rare-earth elements, as an additive element other than the above-mentioned elements. It is to be noted that the OTS layer 31 may contain an element other than the above-mentioned elements within a range that causes no degradation in the effects of the embodiment of the present disclosure.

The high resistance layer 32 in the present embodiment is provided in contact with the OTS layer 31. The high resistance layer 32 in the present embodiment includes a conductive path therein, and controls the operation area of the switch device 1A with the use of the conductive path, which is described later in detail. The high resistance layer 32 may be made, for example, of an oxide of a metal element, a nitride of the metal element, an oxide of a non-metal element, a nitride of the non-metal element, a mixture thereof, etc. The high resistance layer 32 may be made, for example, of an oxide, a nitride, or an oxynitride of Al, gallium (Ga), Mg, Si, hafnium (Hf), a rare-earth element, etc. A deficiency is thereby generated inside the high resistance layer 32 at the time of an initial writing operation, that is, at the time of a forming process, and a conductive path P (for example, see FIG. 4B) having a size of about several nanometers is formed.

It is to be noted that not all of the elements in the high resistance layer 32 may be necessarily in a state of oxide, and part of the elements may be in an oxidized state. Further, the high resistance layer 32 may include N instead of O. N in the high resistance layer 32 serves in a manner similar to that of O. The high resistance layer 32 may desirably have a resistance value having insulation characteristics higher than those of the OTS layer 31. A thickness of the high resistance layer 32 is not particularly limited. However, the high resistance layer 32 may preferably have a thickness, for example, from about 2 nm to about 30 nm both inclusive in order to reduce a thickness of the switch layer 30 and to suppress a leakage current in a non-selection (OFF) state as small as possible.

The top electrode 20 may be made of a publicly-known semiconductor wiring material as with the bottom electrode 10. However, the top electrode 20 may be preferably made of a stable material that does not react with the OTS layer 31 even when subjected to a post annealing process.

The switch device 1A in the present embodiment is decreased in resistance in response to application of a voltage of the switching threshold voltage or higher, but returns to a high resistance state when the application voltage is decreased to a voltage lower than the switching threshold voltage. Specifically, the switch device 1A does not cause phase variation (variation between an amorphous phase and a crystalline phase) of the switch layer 30 (in particular, the OTS layer 31) that is caused by application of a voltage pulse or a current pulse from an unillustrated power source circuit (a pulse application section) via the bottom electrode 10 and the top electrode 20. Also, the switch device 1A does not perform a memory operation, for example, maintaining, also after erasing the application voltage, the conductive path formed as a result of ion movement in response to voltage application. Description is provided below of an operation method and a mechanism of the operation in comparison to a typical switch device 100 (FIG. 2).

Figure 8:
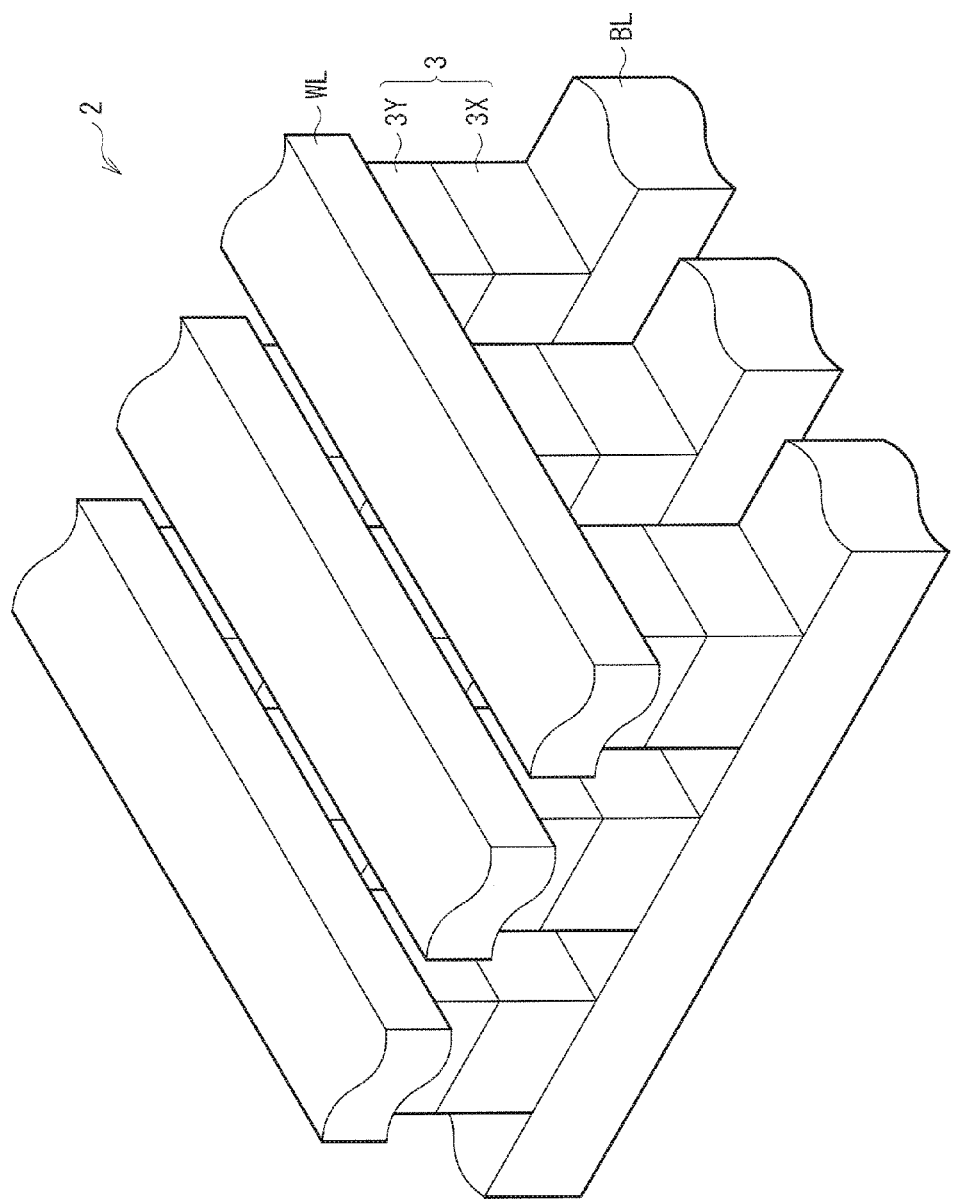
FIG. 8 is a perspective view of a memory cell array that includes the switch device illustrated in FIG. 1.

As described above, increase in capacity of a memory (a memory cell array) is achieved by adopting a cross point array type in which memory cells including lamination of the memory device and the switch device are arranged near cross points of intersecting wirings as illustrated in FIG. 8. In such a cross-point-type memory cell array, a resistance-variation-type memory device (for example, the storage device 3Y described later) may be used as the memory device. The resistance-variation-type memory device may be formed of various materials. Generally, a memory device having a higher write threshold voltage has higher recording retention reliability. Also, the write threshold voltage of the memory device varies between devices. For this reason, it may be necessary to provide an extra margin for the write threshold voltage in a large-scale memory cell array. To give an example, even in a memory device having a write threshold voltage of 1V, a switch device may desirably have a switching threshold voltage equal to or higher than 1 V. For example, when the variations in the write threshold voltage in the memory cell array is ±0.3 V, the switch device may desirably have the switching threshold voltage of 1.3 V or higher. Accordingly, a further higher switching threshold voltage may be desired in the switch device in order to drive the memory device having a high write threshold voltage (for example, of 1.5 V or higher) and high retention reliability without causing any fault in the writing operation.

Figure 2:
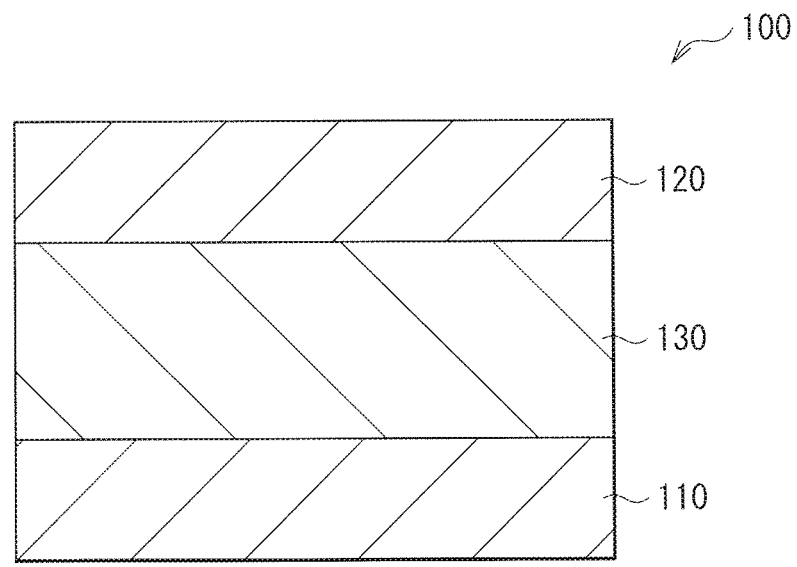
FIG. 2 is a cross-sectional diagram of a switch device as a comparative example of the embodiment of the present disclosure.

The switch device 100 is a typical switch device in which a switch layer 130 configured of chalcogenide is provided between a top electrode 120 and a bottom electrode 110 as illustrated in FIG. 2.

When, for example, a resistance-variation-type storage device (the storage device 3Y) is used as the storage device in the cross-point-array-type memory cell array 2 as illustrated in FIG. 8, it may be desired for the switch device to have sufficient current density in an ON state and to suppress occurrence of a leakage current in an OFF state. In contrast, the switching threshold voltage of the switch device 100 is not so high, which may be, for example, mostly from about 1 V to about 1.5 V. Such a value of the switching threshold voltage has not been sufficient for driving a memory device such as the storage device 3Y. Accordingly, there has been an issue that, when the switch device 100 and the storage device 3Y are used in combination, the switch device performs a switching operation earlier than the memory device, and a sufficient selection ratio (an ON-OFF ratio) between a selected (ON) state and a half-selected (OFF) state is not secured.

One reason for this is because the electrode area of the bottom electrode 110 and the top electrode 120 configuring the switch device 100 serves as an operation region as it is. Many of such switch devices have a high leakage current in a non-selected (OFF) state, and may be easier to cause malfunction (such as errors in writing and erasing operations). Also, some of such switch devices may be superior in terms of low leakage current; however, a switching threshold voltage thereof is as low as 1 V or lower. Accordingly, in order to allow the switch device 100 to satisfy the above-described conditions, it may be necessary to increase the thickness of the switch layer 130 (for example, to about 180 nm). However, in such a case, there has been an issue that miniaturization thereof is prevented.

Moreover, the issue of leakage current becomes more serious in proportion to increase in size of the memory cell array, and a further larger ON-OFF ratio is therefore desired. Accordingly, in a memory cell in which a memory device having a high write threshold voltage and the above-described switch device 100 are used in combination, it has been difficult to cause the memory cell array having a large capacity to operate normally because a write-read margin is small.

In contrast, in the switch device 1A in the present embodiment, the switch layer 30 has a laminated structure including the OTS layer 31 (corresponding to the above-described switch layer 130) configured of chalcogenide and the high resistance layer 32. In the switch device 1A, the minute conductive path P is formed in the high resistance layer 32 at the time of the initial ON operation. A formation region (for example, about several nanometers in a plane direction) of the conductive path P formed inside the high resistance layer 32 serves as the operation region of the switch device 1A.

Figure 3:
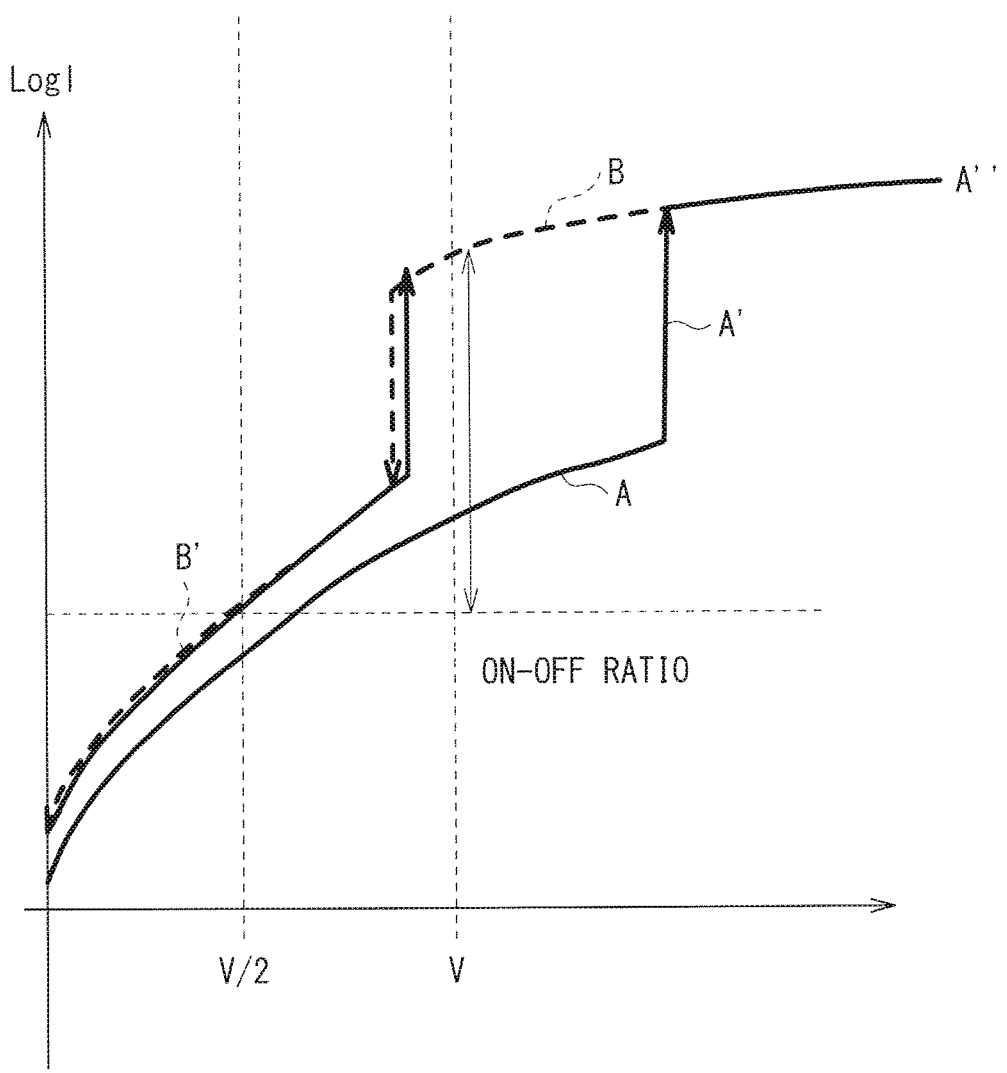
FIG. 3 is a diagram illustrating IV characteristics of the switch device illustrated in FIG. 1.

Specifically, once the conductive path P is formed in the high resistance layer 32, most of the voltage applied to the switch device 1A is applied to the OTS layer 31, and an electric field is thereby applied to the OTS layer 31 (for example, see FIGS. 3 and 4). When intensity of the electric field becomes a certain value or higher, charge carrier (carrier) generated due to ionization collision resulting from an electron state of the chalcogen element increases, which results in radical increase in current. This causes decrease in resistance. Specifically, so-called ovonic threshold switching phenomenon is caused and the switch device 1A therefore becomes an ON state. It is to be noted that, when the application voltage to the switch device 1A is stopped, the carrier caused by the ionization collision is recombined to disappear, and the OTS layer 31 returns to a high resistance state. Thus, the switch device 1A achieves a large ON-OFF ratio.

Hence, it is possible to secure sufficient current density in an ON state and to suppress a leakage current to a non-selected device and a half-selected device in an OFF state, without increasing the thickness of the switch layer 130 (the OTS layer 31, in this example) as in the switch device 100 described above. In other words, it is possible to increase an ON-OFF ratio.

Moreover, the threshold voltage of the switch device 1A is allowed to be adjusted by selecting the thickness, the material, etc. of the high resistance layer 32. Accordingly, an operation is allowed to be performed in a storage unit provided with a storage device in which a high application voltage is necessary as in the storage device 3Y.

The switch device 1A is adjusted by the following method.

FIG. 3 illustrates a relationship (IV characteristics) of the application voltage and a value of a current passing through the electrode in the switch device 1A. FIGS. 4A to 4E schematically illustrate inside of the switch layer 30 in the respective sections (A, A', A", B, and B') of an IV curve illustrated in FIG. 3. First, in the switch device 1A formed by photolithography, dry etching, etc., the conductive path P is formed inside the high resistance layer 32 at the time of the initial ON operation and the operation region of the switch device 1A is determined, as described above.

Figure 4A:
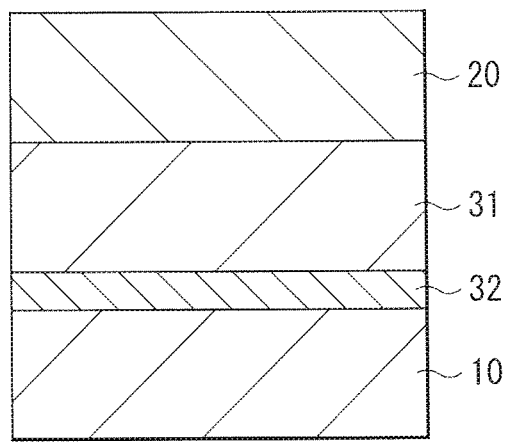
FIG. 4A is a cross-sectional schematic view of the switch device in a region in an IV curve illustrated in FIG. 3.
Figure 4B:
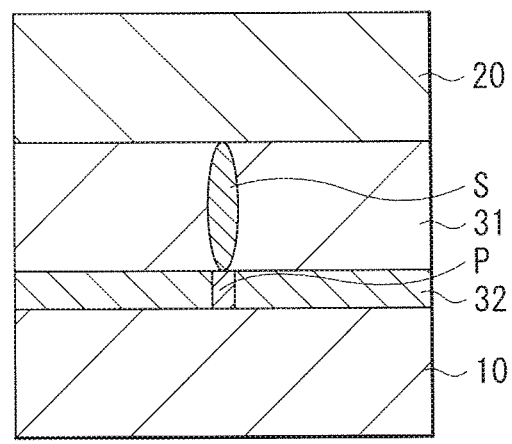
FIG. 4B is also a cross-sectional schematic view of the switch device in a region in the IV curve illustrated in FIG. 3.
Figure 4C:
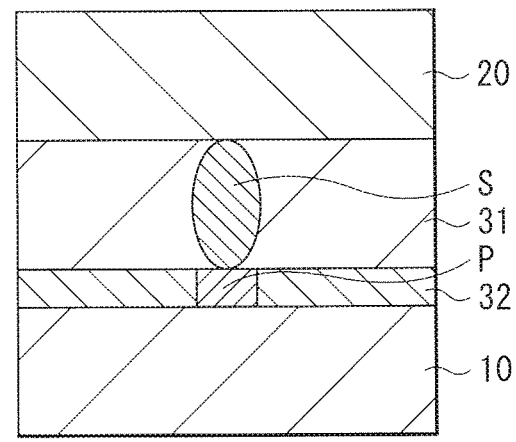
FIG. 4C is also a cross-sectional schematic view of the switch device in a region in the IV curve illustrated in FIG. 3.

The IV curve of the switch device 1A at this time varies as illustrated in FIG. 3. Specifically, the current passing through the switch device 1A is gradually increased in proportion to increase in voltage (A), is then radically increased at a predetermined voltage (the switching threshold voltage) (A'), and subsequently reaches the upper limit (A"). Inside of the switch device 1A (in particular, the switch layer 30) varies as illustrated in FIGS. 4A to 4C in the respective sections A, A', and A" of the IV curve. For example, in the switch device 1A, no variation is seen in the switch layer 30 (the OTS layer 31 and the high resistance layer 32) as illustrated in FIG. 4A until the application voltage becomes the switching threshold voltage. However, as illustrated in FIG. 4B, when the application voltage reaches the switching threshold voltage, the conductive path P is formed in the high resistance layer 32, and an ionization collision region S is generated inside the OTS layer 31, which causes decrease in resistance. The current is radically increased thereby. Thereafter, a voltage is applied to the switch device 1A until the set upper limit current density is achieved. At this time, the sizes of the conductive path P and the ionization collision region S are considered to be increased as illustrated in FIG. 4C. Thus, the forming process is performed on the switch device 1A.

Figure 4D:
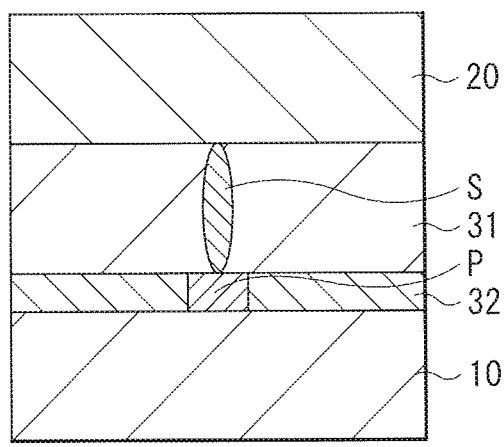
FIG. 4D is also a cross-sectional schematic view of the switch device in a region in the IV curve illustrated in FIG. 3.
Figure 4E:
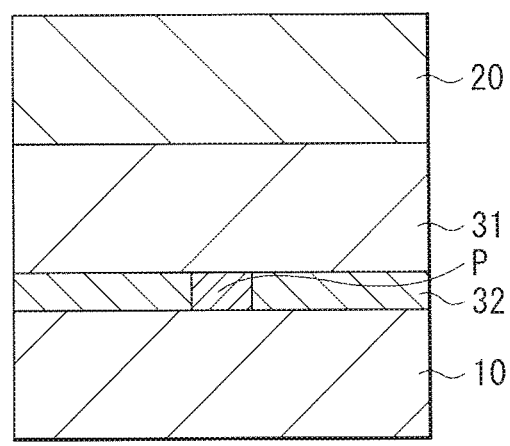
FIG. 4E is also a cross-sectional schematic view of the switch device in a region in the IV curve illustrated in FIG. 3.

Subsequently, when the application voltage is decreased, the IV characteristics of the switch device 1A varies following the path B-B' illustrated in FIG. 3. Specifically, in the switch layer 30 in the switch device 1A, the ionization collision region S generated in the OTS layer 31 is gradually reduced as illustrated in FIG. 4D while the conductive path P (FIG. 4C) formed when the current has reached the upper limit current is maintained. In accordance therewith, the current passing through the switch device 1A is decreased (B). When the voltage reaches a certain threshold voltage, recombination of carriers occurs, the ionization collision region S disappears as illustrated in FIG. 4E, and the resistance value of the OTS layer 31 is radically increased. As illustrated in FIG. 3, the current is thereby radically decreased, and thereafter, the current is also gradually decreased together with the decrease in the application voltage (B').

It is to be noted that the IV characteristics of the switch device 1A at the time of the ON operation for second time or later vary similarly to the path B-B'.

Figure 5:
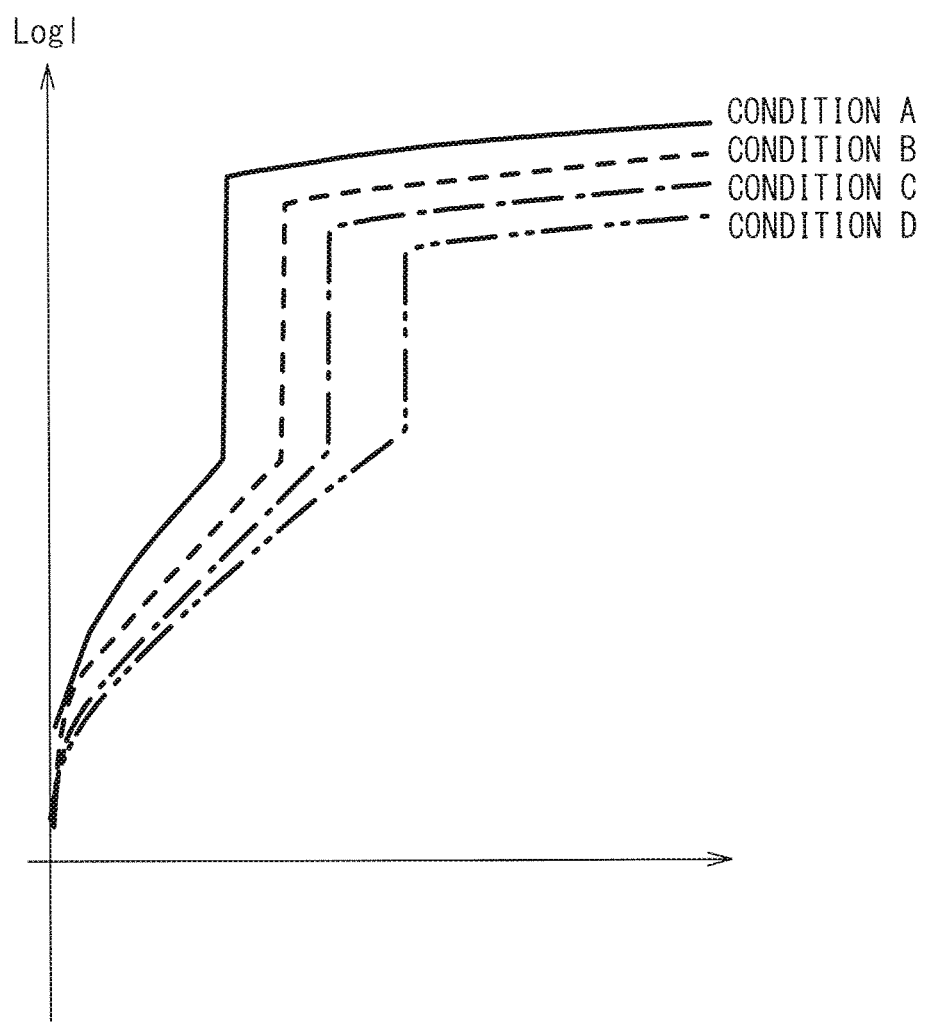
FIG. 5 is a diagram illustrating IV characteristics under respective Forming conditions (A) to (D).
Figure 6A:
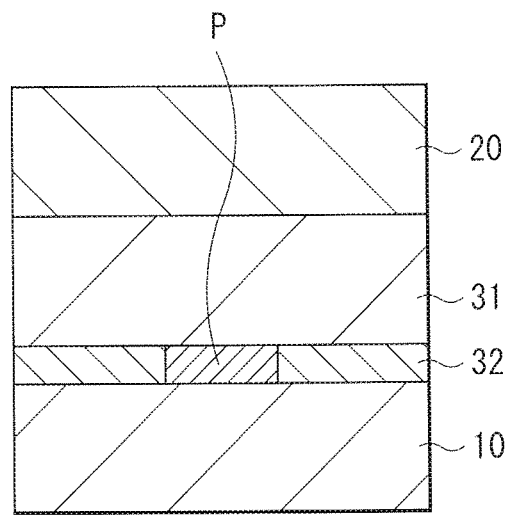
FIG. 6A is a cross-sectional schematic view of the switch device under Forming condition (A).
Figure 6B:
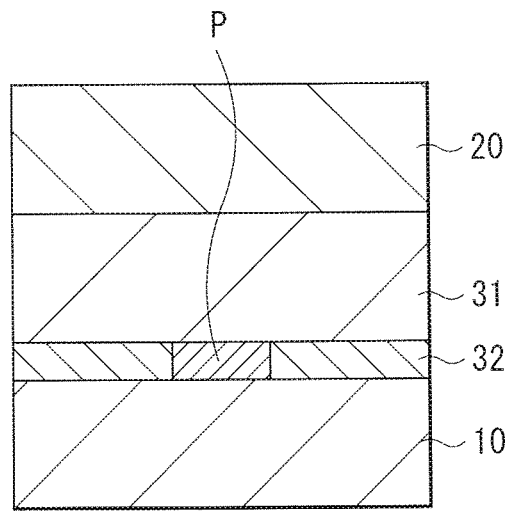
FIG. 6B is a cross-sectional schematic view of the switch device under Forming condition (B).
Figure 6C:
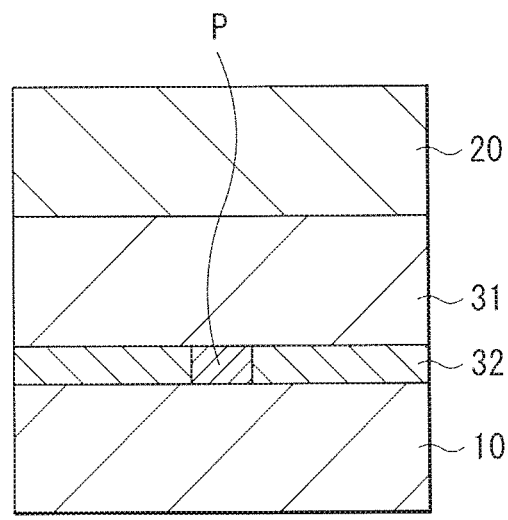
FIG. 6C is a cross-sectional schematic view of the switch device under Forming condition (C).
Figure 6D:
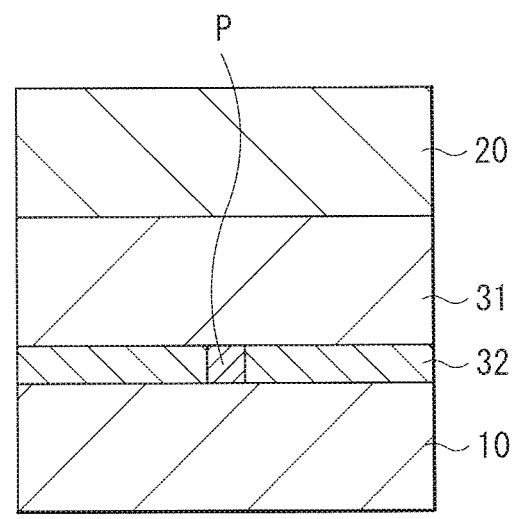
FIG. 6D is a cross-sectional schematic view of the switch device under Forming condition (D).

FIG. 5 illustrates IV characteristics at the time of ON operation for the second time or later under respective forming conditions (Conditions A to D). FIGS. 6A to 6D schematically illustrate a cross-sectional configuration of the switch device 1A under the respective conditions. It is to be noted that, concerning the forming condition, a forming current is gradually decreased from Condition A to Condition D. As can be seen from FIGS. 6A to 6D, when the initial ON current is increased, the formation region of the conductive path P formed inside the high resistance layer 32 is increased, which allows a higher ON current to be passed.

Specifically, the characteristics of the switch device 1A are allowed to be controlled by varying the current value at the time of the initial ON operation (at the time of the forming process), or the maximum value of the application voltage. However, adjustment may be necessary because the leakage current at the time of OFF state may be increased when the conductive path is made excessively large.

As described above, by performing the above-described operation, it is possible to achieve the switch device 1A that has a desired characteristics, specifically, the switch device 1A that is varied to be in a low resistance state in a selected state (an ON state) and is varied to be in a high resistance state in a non-selected state (an OFF state). Also, it is possible to control operation characteristics in the writing operations for the second time and later by the forming operation by the initial writing operation.

As described above, in the present embodiment, the high resistance layer 32 is laminated on the OTS layer 31 configuring the switch layer 30, and the operation region of the switch layer 30 is therefore limited. This makes it possible to reduce occurrence of the leakage current at the time of non-selection or half-selection (an OFF state). Also, the switching threshold voltage and the ON-OFF ratio are increased. Accordingly, it is possible to provide a storage unit that has high density and large capacity.

Figure 7A:
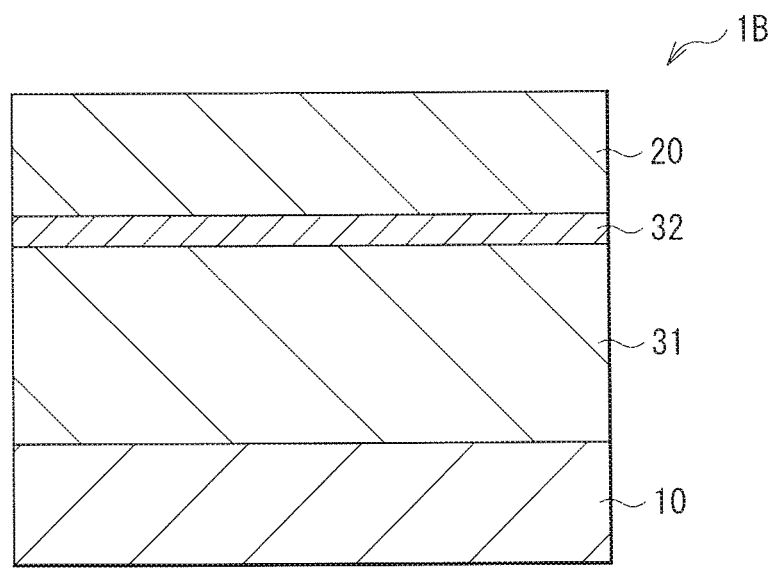
FIG. 7A is a cross-sectional view illustrating another example of the configuration of the switch device according to the embodiment of the present disclosure.
Figure 7B:
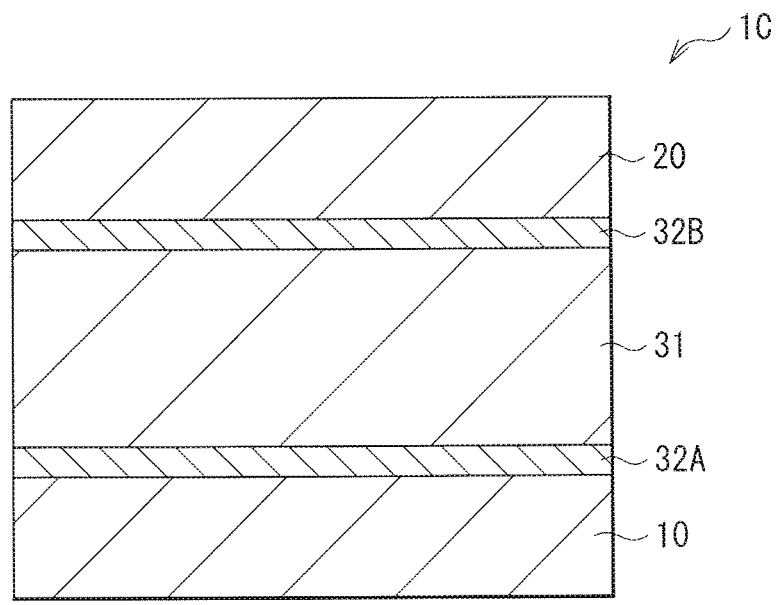
FIG. 7B is a cross-sectional view illustrating another example of the configuration of the switch device according to the embodiment of the present disclosure.

It is to be noted that, as long as the OTS layer 31 is in contact with the high resistance layer 32, the laminated structure of the switch device 1A in the present embodiment is not limited to the laminated structure illustrated in FIG. 1. For example, as illustrated in FIG. 7A, the high resistance layer 32 may be formed on the top electrode 20 side. Alternatively, as illustrated in FIG. 7B, high resistance layers 32A and 32B may be formed to sandwich the OTS layer 31, specifically, on both of the top electrode 20 side and the bottom electrode 10 side. Moreover, a multi-layer structure may be adopted in which a plurality of sets of the OTS layer 31 and the high resistance layer 32 are laminated.

[1-2. Storage Unit]

A storage unit (a memory) may be allowed to be configured by arranging a number of storage devices 3Y described later, for example, in a column or in a matrix. In this case, the switch device 1A according to the embodiment of the present disclosure is connected, as the switch device 3X, in series to the storage device 3Y, and thereby configures the memory cell 3. The memory cell 3 is connected to a sense amplifier, an address decoder, a write circuit, an erase circuit, a read circuit, etc. via wirings.

FIG. 8 illustrates an example of a so-called cross-point-array type storage unit (the memory cell array 2) in which the memory cells 3 are arranged at intersections (cross points) of intersecting wirings. In the memory cell array 2, a wiring (for example, a bit line BL (a row line)) connected to each of the memory cells 3 on the bottom electrode 10 side and a wiring (for example, a word line WL (a vertical line)) connected to each of the memory cells 3 on the top electrode 20 side are provided to intersect with each other, and for example, each of the memory cells 3 is arranged near the intersection of these wirings. Thus, by adopting the cross point array structure, it is possible to reduce the floor area per unit cell and to achieve increase in capacity.

Figure 9A:
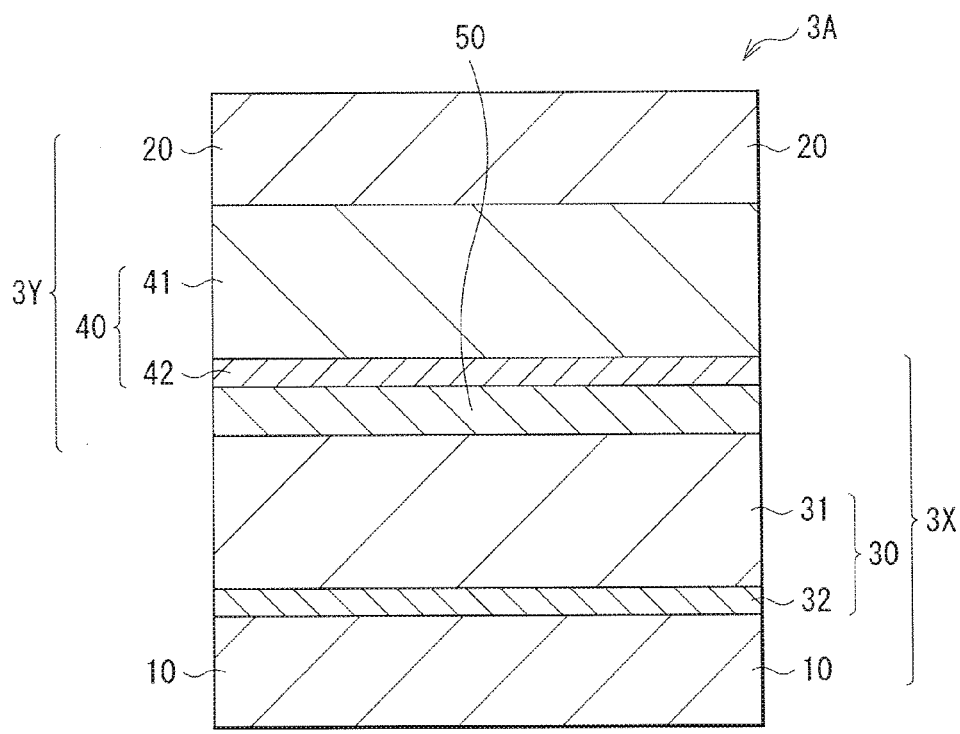
FIG. 9A is a cross-sectional view illustrating an example of a configuration of a memory cell illustrated in FIG. 8.

The storage device 3Y configuring the memory cell 3 may include, for example, a bottom electrode, a storage layer 40, and a top electrode in order. The storage layer 40 may be configured, for example, of a laminated structure in which a resistance variation layer 42 and an ion source layer 41 are laminated from the bottom electrode side, or of a single layer structure of the resistance variation layer 42. It is to be noted that an intermediate electrode 50 is provided between the switch layer 30 and the storage layer 40 in this example, and the intermediate electrode 50 serves as both of the top electrode of the switch device 3X and the bottom electrode of the storage device 3Y. Specifically, for example, as illustrated in FIG. 9A, the memory cell 3 has a configuration in which the switch layer 30, the intermediate electrode 50, the resistance variation layer 42, and the ion source layer 41 are laminated in order between the bottom electrode 10 and the top electrode 20.

The storage device may be configured of any device that is a so-called resistance-variation-type storage device (memory device) in which the storage layer 40 may have, for example, a laminated structure of the ion source layer 41 and the resistance variation layer 42 as described above. For example, a device such as a resistance variation memory that is made of a transition metal oxide, a PCM (Phase Change Memory), and an MRAM (Magnetoresistive Random Access Memory) may be used.

The ion source layer 41 contains a movable element that forms a conductive path inside the resistance variation layer 42 in response to application of an electric field. Examples of the movable element may include transition metal elements (Groups 4 to 6 elements in the periodic table) and chalcogen elements. The ion source layer 41 may contain one or more of the transition metal elements and one or more of the chalcogen elements. Further, the ion source layer 41 may contain oxygen (O), nitrogen (N), or elements such as Al, Cu, manganese (Mn), cobalt (Co), iron (Fe), nickel (Ni), platinum (Pt), and Si other than the above-mentioned elements.

The resistance variation layer 42 may be configured, for example, of an oxide of a metal element, a nitride of the metal element, an oxide of a non-metal element, or a nitride of the non-metal element. In the resistance variation layer 42, a resistance value thereof is varied when a predetermined voltage is applied between the bottom electrode 10 and the top electrode 20. Specifically, when a voltage is applied between the bottom electrode 10 and the top electrode 20, the transition metal element contained in the ion source layer 41 moves into the resistance variation layer 42 and a conductive path is formed thereby, which causes the resistance variation layer 42 to have a low resistance. Alternatively, a structural deficiency such as an oxygen deficiency or a nitrogen deficiency may be caused inside the resistance variation layer 42, and the conductive path may be formed thereby, which causes the resistance variation layer 42 to have a low resistance. Further, by applying a voltage in an opposite direction, the conductive path is disconnected or conductivity is varied. Thus, the resistance of the resistance variation layer 42 is caused to have a high resistance.

It is to be noted that not all of the metal elements and the non-metal elements contained in the resistance variation layer 42 may be necessarily in an oxide state, and part thereof may be in an oxidized state. It is enough that the initial resistance value of the resistance variation layer 42 achieves, for example, a device resistance of from about several M$\Omega$ to about several hundred G$\Omega$. An optimum value of the initial resistance value of the resistance variation layer 42 varies depending on the size of the device, the resistance value of the ion source layer 41, etc. However, the resistance variation layer 42 may preferably have a thickness, for example, from about 1 nm to about 10 nm.

The intermediate electrode 50 may be made of any material, as long as, the intermediate electrode 50 is made, for example, of an inactive material that is less likely to cause ion movement and a redox reaction such as dissolution and precipitation of ions into the OTS layer 31 and the ion source layer 41 that contain chalcogenide in response to application of an electric field.

The storage device 3Y is a resistance-variation-type storage device in which electric characteristics (a resistance value) of the storage layer 40 are varied when a voltage pulse or a current pulse is applied thereto from an unillustrated power source circuit (a pulse application section) via the bottom electrode 10 and the top electrode 20. Thus, a writing operation, an erasing operation, and further, a reading operation of information are performed.

Specifically, in the storage device 3Y, when a voltage or a current pulse in "forward direction" (for example, a negative potential on the first electrode side and a positive potential on the second electrode side) is applied to the device in the initial state (in a high resistance state), the metal element (for example, a transition metal element) contained in the ion source layer is ionized to be diffused into the storage layer (for example, into the resistance variation layer) or oxygen ions move to generate an oxygen deficiency inside the resistance variation layer. Thus, a low resistance portion (a conductive path) that has a low oxidization state is formed inside the storage layer, and the resistance of the resistance variation layer is decreased (a recorded state). When a voltage pulse in "negative direction" (for example, a positive potential on the first electrode side and a negative potential on the second electrode side) is applied to the device in the low resistance state, the metal ions inside the resistance variation layer moves into the ion source layer or the oxygen ions move from the ion source layer, and the oxygen deficiency in the conductive path portion is reduced. The conductive path containing the metal element disappears thereby, and the resistance of the resistance variation layer becomes a high state (an initial state or an erased state). It is to be noted that, in the case where the storage layer 40 is configured of a single layer of the resistance variation layer 42, when a voltage (or a current pulse) in the forward direction is applied, a deficiency is generated by the electric field applied to the resistance variation layer 42, and when a voltage pulse is applied in the negative direction, the deficiency is recovered by movement of the oxygen ions, the nitrogen ions, etc. inside the resistance variation layer.

Figure 9B:
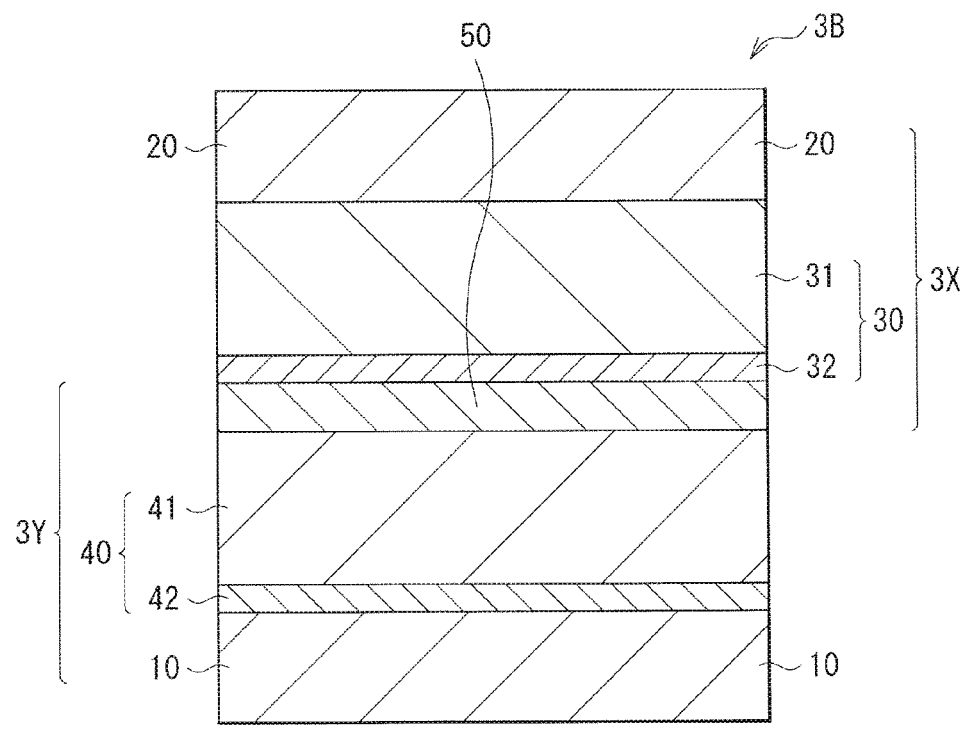
FIG. 9B is a cross-sectional view illustrating another example of the configuration of the memory cell illustrated in FIG. 8.
Figure 9C:
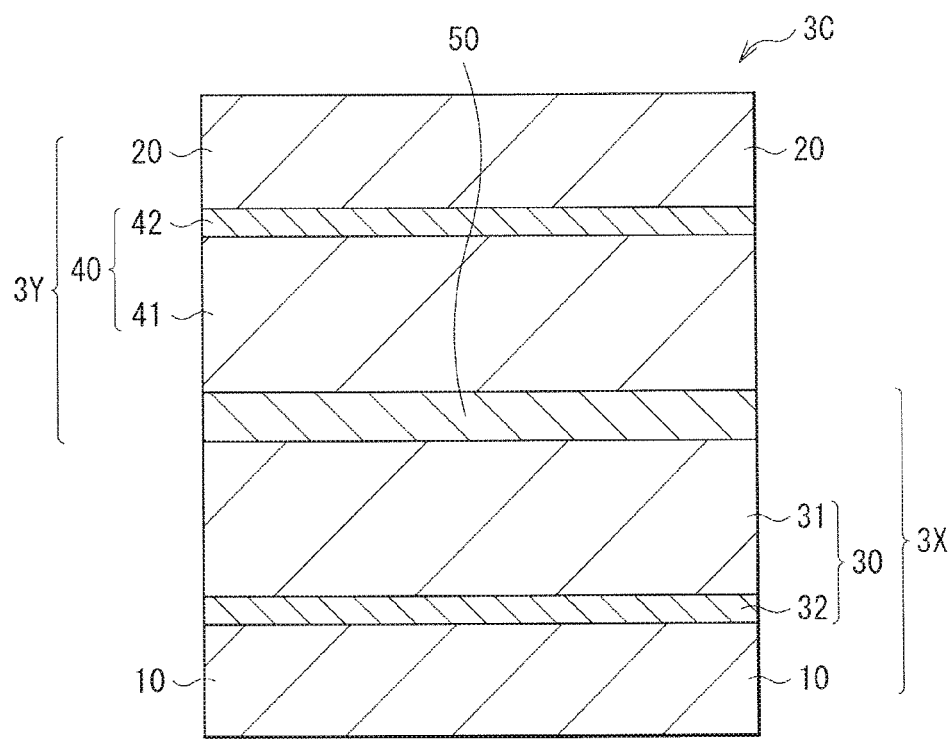
FIG. 9C is a cross-sectional view illustrating another example of the configuration of the memory cell illustrated in FIG. 8.

It is to be noted that the laminated structures of the switch device 3X and the storage device 3Y in the memory cell 3 are not limited to the lamination order of a memory cell 3A illustrated in FIG. 9A. For example, as in a memory cell 3B illustrated in FIG. 9B, the switch layer 30 may be provided on the top electrode 20 side and the storage layer 40 may be provided on the bottom electrode 10 side with the intermediate electrode 50 in between. Alternatively, as in a memory cell 3C illustrated in FIG. 9C, the OTS layer 31 and the ion source layer 41 may be arranged to face each other with the intermediate electrode 50 in between, and the high resistance layer 32 and the resistance variation layer 42 may be arranged on the bottom electrode 10 side and on the top electrode 20 side, respectively.

Figure 10A:
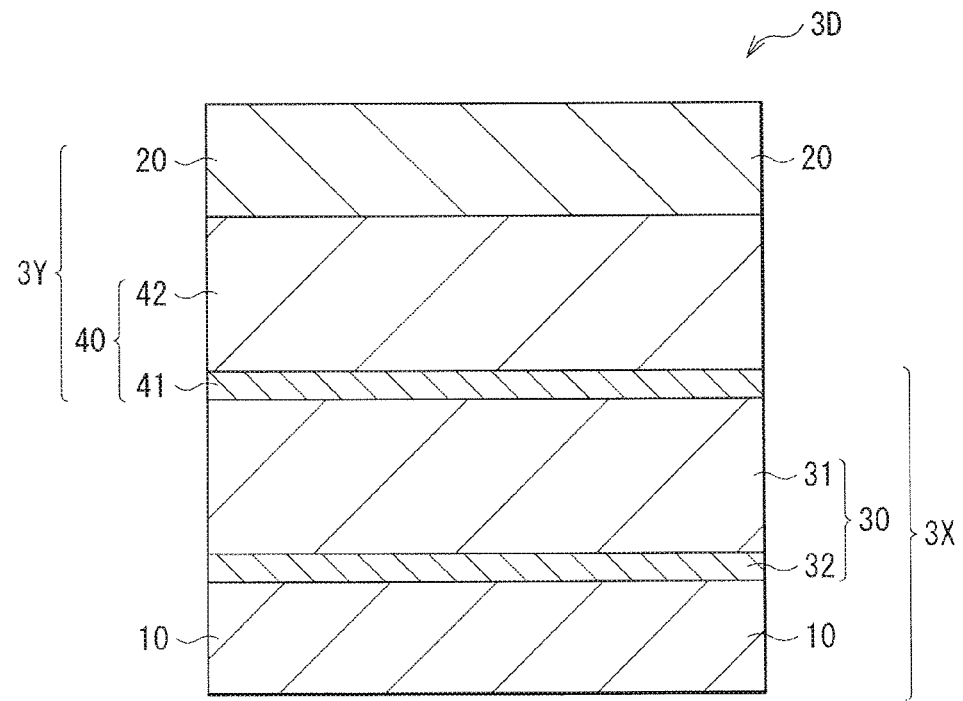
FIG. 10A is a cross-sectional view illustrating another example of the configuration of the memory cell illustrated in FIG. 8.
Figure 10B:
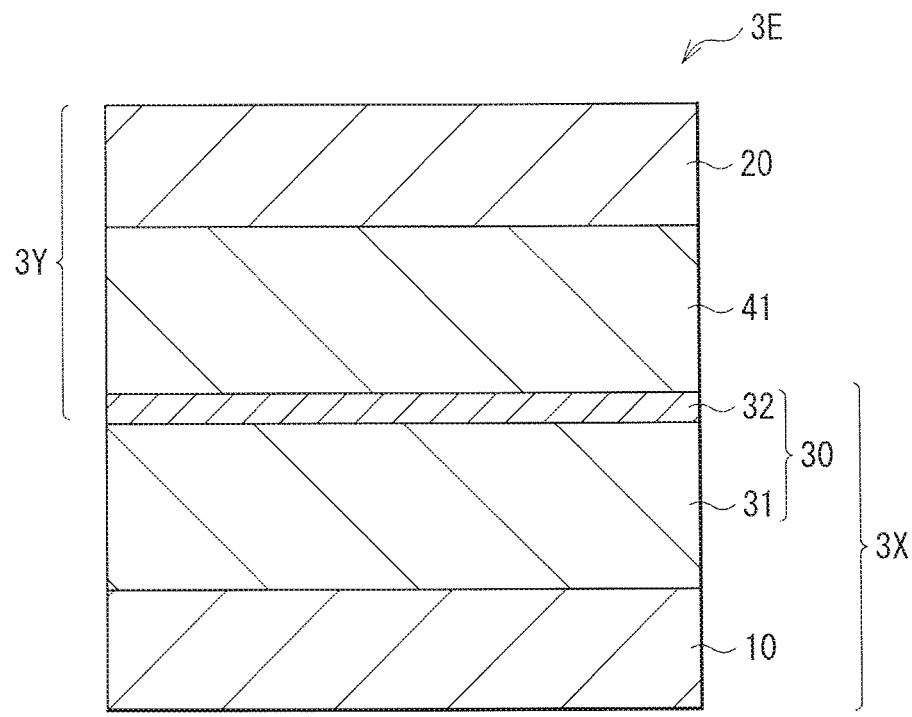
FIG. 10B is a cross-sectional view illustrating another example of the configuration of the memory cell illustrated in FIG. 8.
Figure 10C:
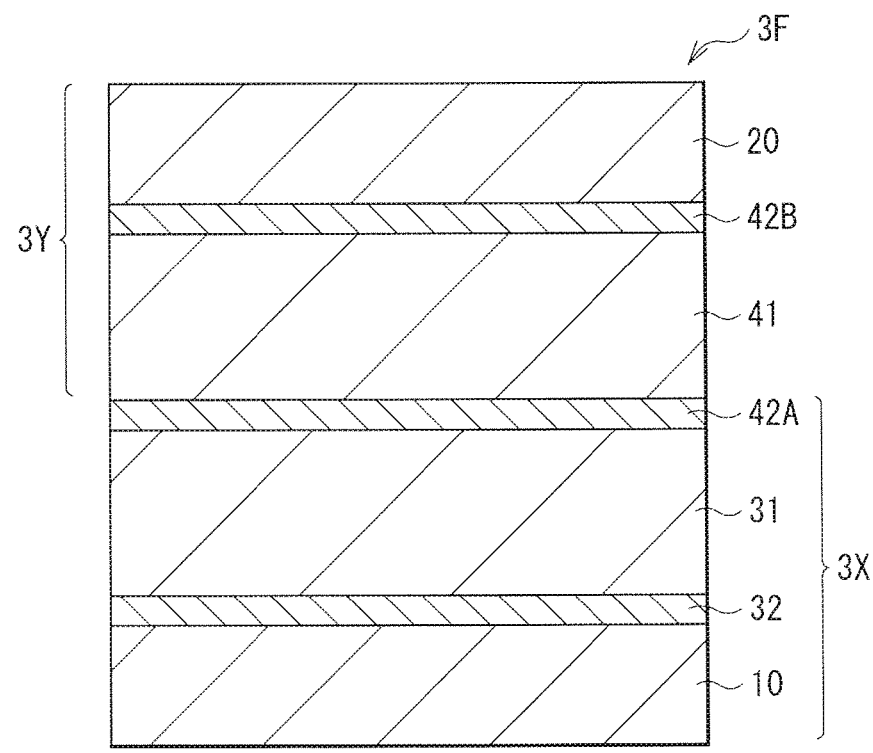
FIG. 10C is a cross-sectional view illustrating another example of the configuration of the memory cell illustrated in FIG. 8.

Moreover, the memory cell 3 may have a configuration in which the intermediate electrode 50 is omitted. In this case, as in a memory cell 3D illustrated in FIG. 10A, there may be adopted a configuration in which the switch layer 30 including the high resistance layer 32 and the OTS layer 31 that are provided in order from the bottom electrode 10 side and the storage layer 40 including the resistance variation layer 42 and the ion source layer 41 that are provided in order from the bottom electrode 10 side are simply laminated. It is to be noted that the lamination order of the switch layer 30 and the ion source layer 40 may be opposite. Moreover, because generation and disappearing of the conductive path in the high resistance layer 32 described above are operations similar to those of the resistance variation layer 42 in the storage device 3Y, the high resistance layer 32 may serve as the resistance variation layer 42. Accordingly, there may be adopted, for example, a configuration in which the OTS layer 31 and the ion source layer 41 are arranged with the high resistance layer 32 in between so that the high resistance layer 32 of the switch layer 30 serves as the resistance variation layer 42 of the storage layer 40, as in the memory cell 3E illustrated in FIG. 10B. Moreover, for example, as in a memory cell 3F illustrated in FIG. 10C, the resistance variation layers 42 may be configured of two layers (resistance variation layers 42A and 42B) provided on both of the bottom electrode 10 side and the top electrode 20 side of the ion source layer 41, which may be laminated on the switch layer 30.

It is to be noted that the storage unit in the present embodiment may be similar also in a case where a configuration of a so-called PCM or MRAM is applied to the storage layer 40.

FIGS. 11A to 11D each illustrate a relationship between an application voltage and a value of a current passing through the electrode at the time of a writing operation (for example, a forward bias) and at the time of an easing operation (for example, a reverse bias) in the switch device 1A (1B, 1C, or 3X) of the present embodiment, the storage device 3Y, or the memory cell 3 including the switch device 1A (1B, 1C, or 3X) and the storage device 3Y in combination. A solid line shows IV characteristics upon voltage application, and a dotted line shows IV characteristics at the time when the application voltage is swept in a decreasing direction.

Figure 11A:
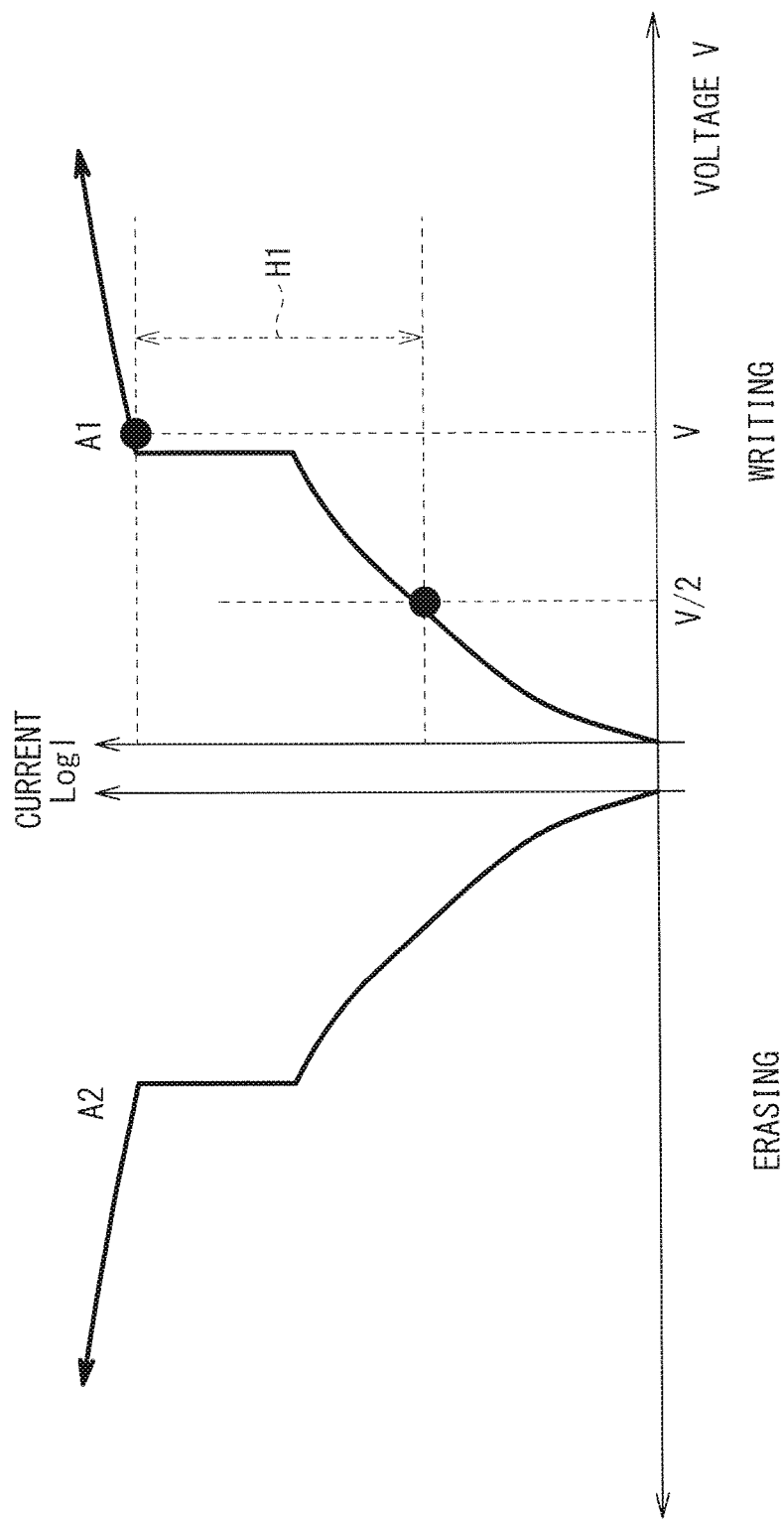
FIG. 11A is a diagram illustrating IV characteristics upon a writing operation and an erasing operation of the memory cell illustrated in FIG. 8.

FIG. 11A illustrates the IV characteristics of the switch device 3X. When a forward bias (a write voltage, in this example) is applied, in the switch device 3X, a current is increased in accordance with increase in the application voltage as described above. However, when the voltage is over a certain threshold voltage (the switching threshold voltage), the current is radically increased due to ovonic threshold switching or resistance is decreased, which causes an ON state. Subsequently, when the application voltage is decreased, the value of the current passing through the electrode in the switch device 3X is gradually decreased. In the operation for the second time or later, similar resistance variation is caused upon both of increase and decrease in the application voltage. Specifically, the resistance is radically increased at a voltage equivalent to that upon increase, which causes an OFF state (B1). Specifically, the resistance value of the switch device 3X becomes a low resistance state in response to application of the write voltage, but returns to a high resistance state when the application voltage is decreased to the threshold or lower and the resistance value at the time of voltage application is not maintained.

FIG. 11B illustrates the IV characteristics of the storage device 3Y. As can be seen from FIG. 11B, in the storage device 3Y, the current value is increased in accordance with increase in application voltage. However, a writing operation due to the conduction path formation in the resistance variation layer 42 in the storage layer 40 is performed at a certain threshold voltage, which causes the resistance value of the storage device 3Y to be varied to a low resistance state. In other words, the resistance value of the storage device 3Y becomes a low resistance state in response to application of the write voltage, and the resistance state is maintained also after stopping the application voltage (B1).

Figure 11C:
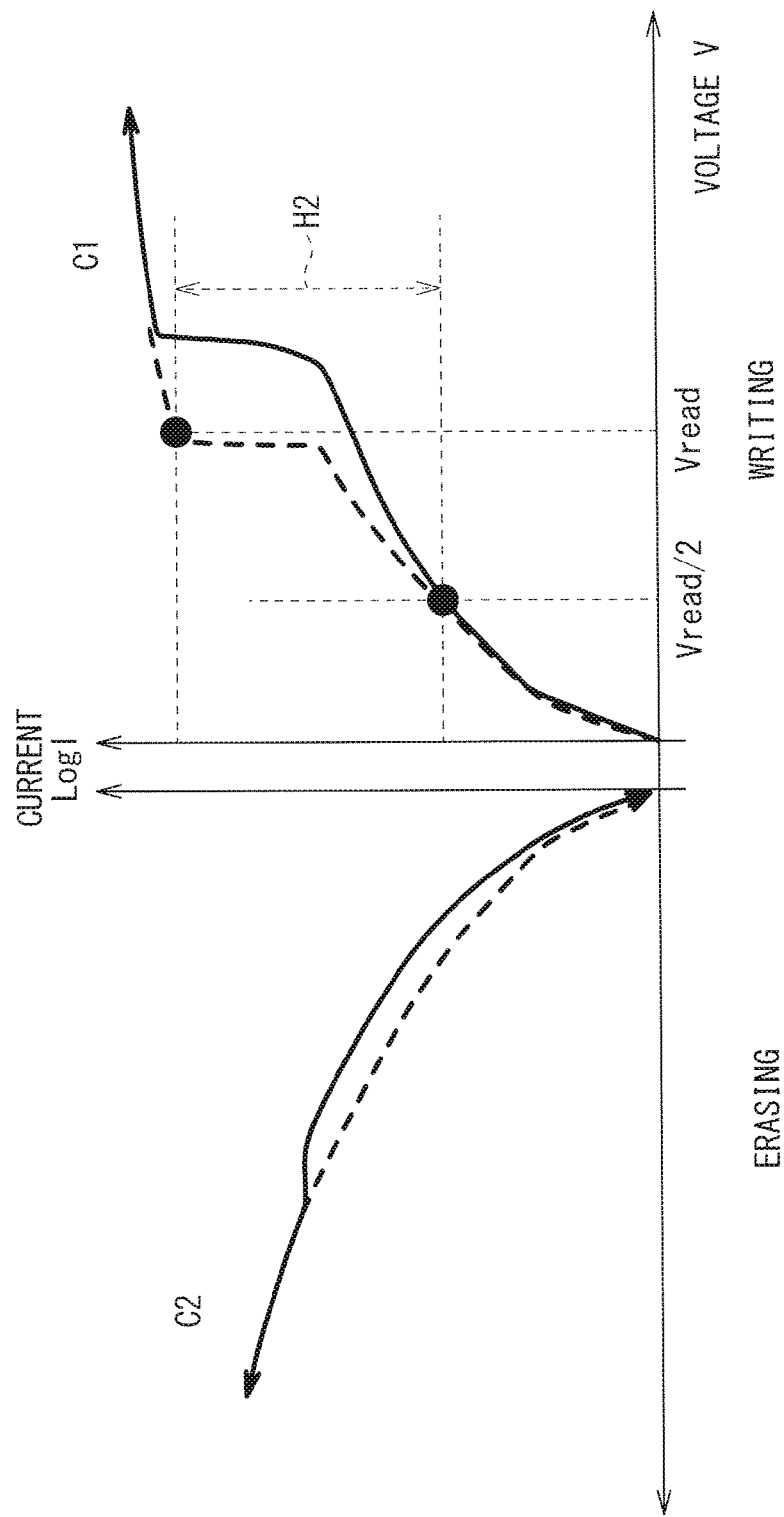
FIG. 11C is a diagram illustrating IV characteristics of the memory cell illustrated in FIG. 8.

FIG. 11C illustrates the IV characteristics of the memory cell 3. Switching behavior of the current value at the time of starting and stopping application of the write voltage to the memory cell 3 in which the above-described storage device 3Y and the above-described switch device 3X are used in combination is that (C1) obtained by combining the switching behaviors of the memory device 3Y (A1) and the switch device 3X (B1). For example, in a case of a cross point array of a V/2 bias scheme, a voltage larger than a threshold that causes radical resistance variation on the IV curve in C1 of the memory cell 3 is set as a read voltage (Vread), and Vread/2 is set to be a voltage smaller than the threshold causing the resistance variation. Accordingly, even when it is possible to achieve a large selection ratio defined by a current ratio of a bias (ON) and a Vread/2 bias (OFF). Also, as described above, the IV curve C1 of the memory cell 3 is a synthesized curve of the IV curve B1 of the switch device 3X and the IV curve of the storage device 3Y. Therefore, a larger selection ratio is achieved as the resistance variation (or the current variation) before and after the ovonic threshold switching in the switch device 3X is larger. Accordingly, in the switch device 3X in the present embodiment, achievement of a large ON-OFF ratio may be preferable, which results in increase in selection ratio. Further, because the reading margin is increased as the selection ratio is larger, it becomes possible to increase the cross point array size without a reading operation error. This makes it possible to further increase capacity of the memory cell array.

Figure 11D:
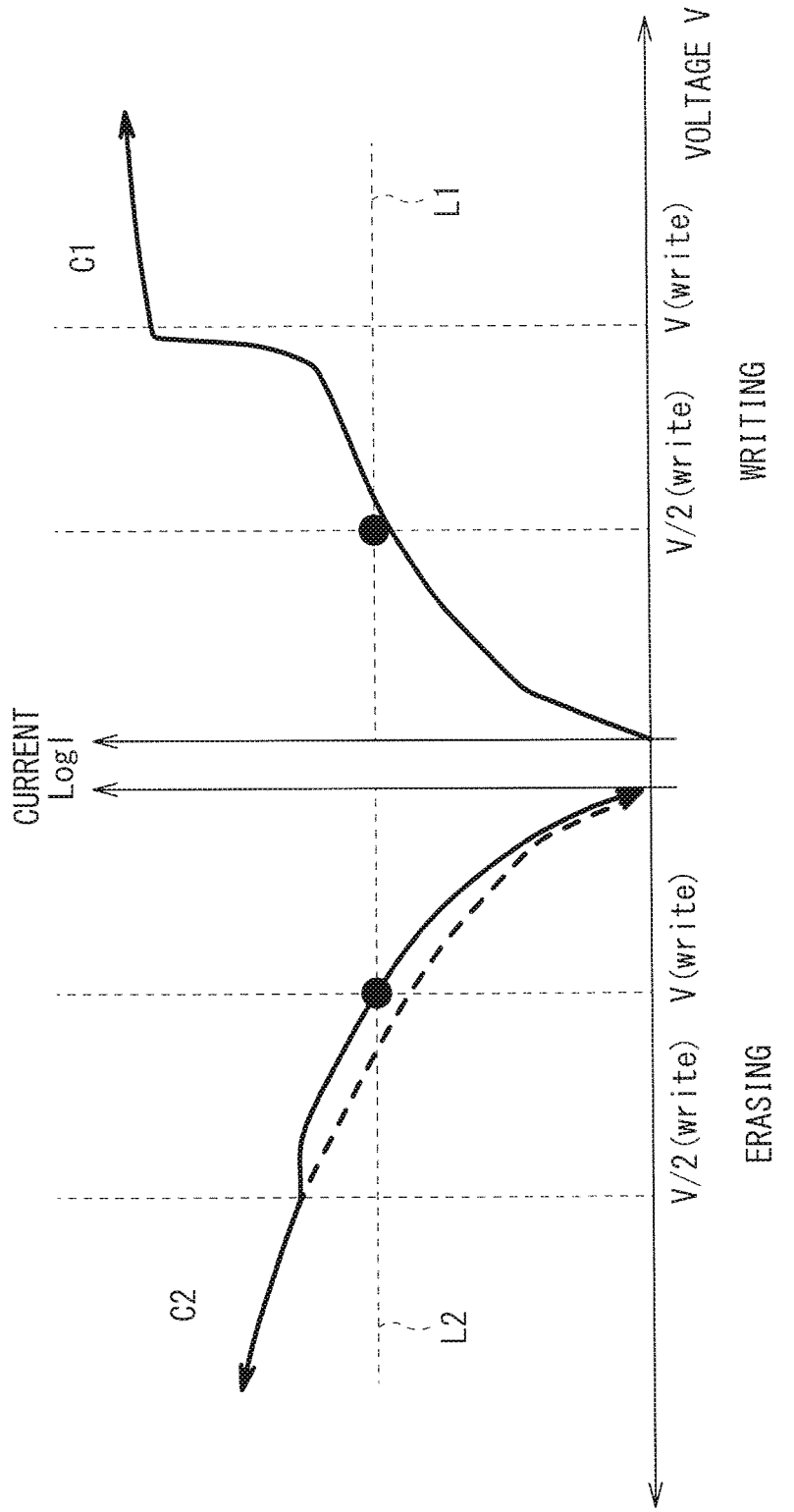
FIG. 11D is a diagram illustrating IV characteristics of the memory cell illustrated in FIG. 8.

This is applicable not only to the reading operation but is also similarly applicable to the writing operation. FIG. 11D illustrates the IV characteristics of the memory cell 3 as in FIG. 11C. As described above, in the cross point array, a number of bits are connected to the bit line BL or the word line WL that is the same as that of the targeted memory cell. For this reason, as illustrated in FIG. 11D, when a leakage current at the time of non-selection that is biased to Vwrite/2 and is shown as an intersection of Vwrite/2 and the IV loop in a Set state of the dotted line of the IV curve C1 is large, a writing error may be caused in a non-selected memory cell. Accordingly, in the writing operation, it may be necessary to set the write voltage Vwrite to a voltage that achieves a current necessary when performing a writing operation on the storage device 3Y, and further, to suppress the leakage current to be in an extent that does not cause a writing error in the non-selected memory cell that is biased to Vwrite/2. As the leakage current at the time of non-selection that is biased to Vwrite/2 is smaller, it is possible to allow a larger-scale cross point array to operate without a writing error. Accordingly, increase in the selection ratio of the switch device 3X leads to increase in capacity of the memory cell array also at the time of the writing operation.

On the other hand, when a reverse bias (an erasure voltage, in this example) is applied, the variation in the current value at the time of erasure voltage application in the switch device 3X shows a behavior similar to that of a site to which the write voltage is applied (B2). In contrast, the variation in the current value at the time of erasure voltage application in the storage device 3Y is varied from a low resistance state to a high resistance state in response to application of a voltage higher than an erasure threshold voltage (A2). As illustrated in FIGS. 11A to 11C, when the IV characteristics of A2 and B2 are synthesized, the IV characteristics C2 of the memory cell upon erasure bias is obtained. In the cross point array of a V/2 bias scheme, because a usual reading bias is set on the writing side, a disturb current at Vreset/2 bias may be an issue. However, also concerning this point, as in the case of the forward bias, a larger ON-OFF ratio of the switch device 3X, that is, a larger selection ratio, and a smaller leakage current in an OFF state are advantageous in increase in scale of the cross point array.

The storage unit of the present embodiment is applicable to various memory units other than the memory unit that uses the resistance-variation-type storage device 3Y. For example, the storage unit of the present embodiment is applicable to a memory form of any of a PROM in which writing is allowed only once, an EEPROM in which erasure is allowed to be performed electrically, and a so-called RAM in which writing, erasure, and reproduction are allowed to be performed at high speed.

Also, in the storage unit of the present embodiment, the configuration is formed by arranging a plurality of memory cells 3 in a plane (two-dimensionally). However, for example, the memory cells 3 may be laminated in multiple layers to achieve a three-dimensional configuration. This makes it possible to provide a storage unit (a memory) having higher density and larger capacity.

[2. Examples]

Specific Examples of the embodiment of the present disclosure are described below.

[Experiment 1]

First, the bottom electrode 10 made of TiN was cleaned by reverse sputtering. Thereafter, a $SiO_2$ film was formed on TiN to have a thickness of 2 nm to form the high resistance layer 32. Subsequently, a GeTe film is formed to have a thickness of 40 nm as the OTS layer 31, and then, W was formed to have a thickness of 30 nm to form the top electrode 20. Subsequently, a miniaturization process was performed to cause the device size to be 100 nmφ by publicly-known techniques such as photolithography and dry etching. The switch device 1A (Sample 1) was thus fabricated. Also, as a comparative example, the switch device 100 (Sample 2) in which the high resistance layer 32 was not formed was fabricated. A relationship between an application voltage and a value of a current passing through each electrode was measured for each of Samples 1 and 2, and IV characteristics thereof were illustrated in FIG. 12.

Figure 12:
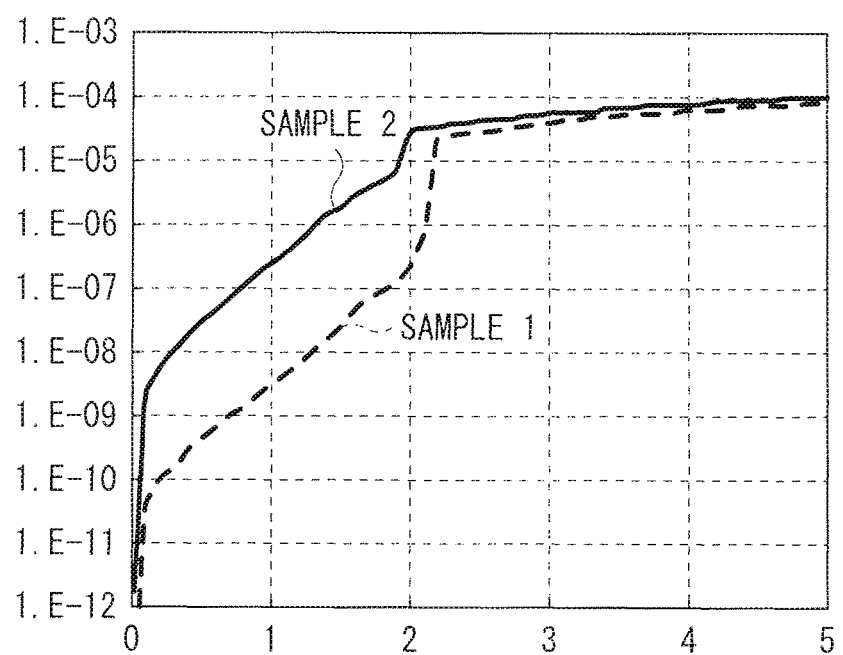
FIG. 12 is an IV characteristic diagram of Experiment 1 of an embodiment of the present disclosure.

As can be seen from FIG. 12, in Sample 1 that is the present embodiment, the threshold voltage was increased compared to Sample 2. The ON-OFF ratio was also larger than that in Sample 2. In other words, it can be seen that the switch device 1A achieves both increase in threshold voltage and increase in resistance variation ratio.

It may be considered that this is because the high resistance layer 32 was formed in contact with the OTS layer 31. Specifically, the conductive path is formed inside the high resistance layer 32 in response to application of a voltage that is higher than a certain voltage. This causes a low resistance state, and limits the operation region of the switch layer 30. Thereafter, the application voltage reaches the threshold voltage, and a high current is thereby passed through the switch device 1A.

[Experiment 2]

Next, a MeTeBO film having a thickness of 40 nm was formed as the OTS layer 31, and a $SiO_2$ film having a thickness of 2 nm was formed as the high resistance layer 32. The switch device 1A (Sample 3) was fabricated thereby. In a similar manner, the switch device 1A (Sample 4) was fabricated in which a MgTeBO film having a thickness of 40 nm was formed as the OTS layer 31 and a SiN film having a thickness of 5 nm was formed as the high resistance layer 32. Other than this, the switch device 100 (Sample 5) was fabricated for comparison in which only the OTS layer 31 configured of a MgTeBO film was formed between the electrodes (the high resistance layer 32 was not formed). The IV characteristics of Samples 3 to 5 were illustrated in FIG. 13A (Sample 3), FIG. 13B (Sample 4), and FIG. 13C (Sample 5).

Figure 13A:
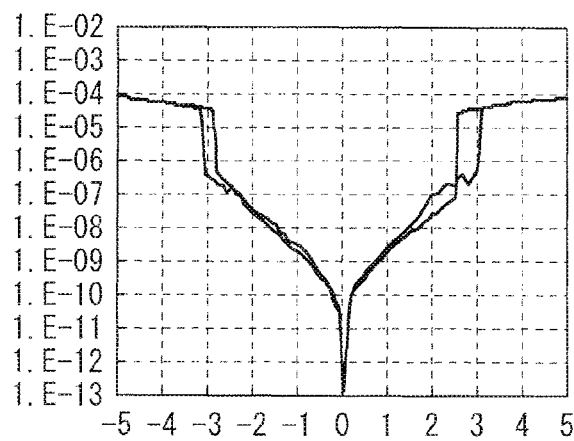
FIG. 13A is an IV characteristic diagram of Experiment 2 (Sample 3) of an embodiment of the present disclosure.
Figure 13B:
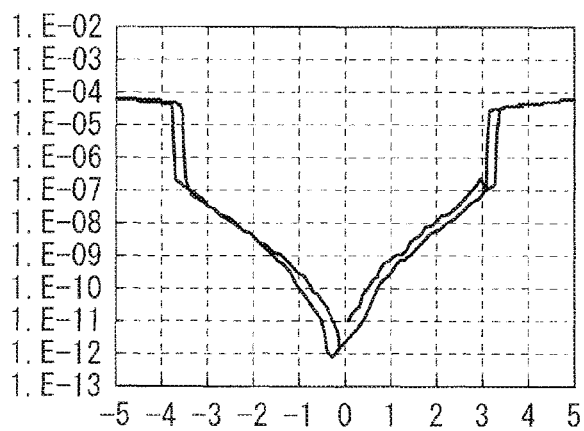
FIG. 13B is an IV characteristic diagram of Experiment 2 (Sample 4) of an embodiment of the present disclosure.
Figure 13C:
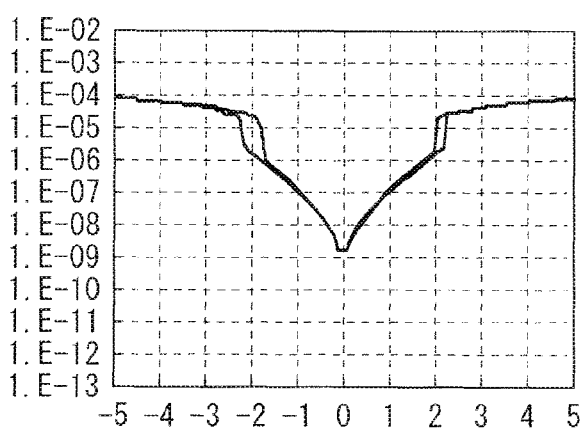
FIG. 13C is an IV characteristic diagram of Experiment 2 (Sample 5) of an embodiment of the present disclosure.
Figure 14:
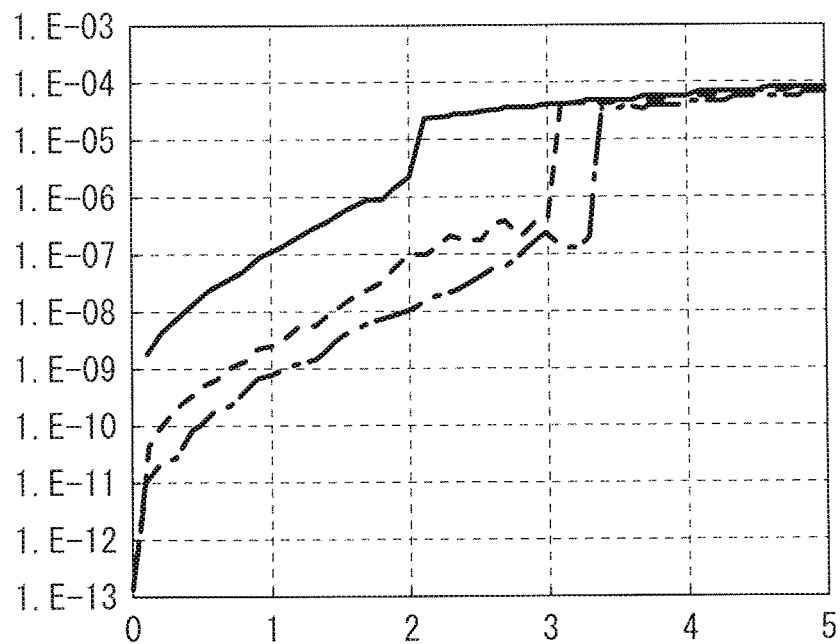
FIG. 14 is a characteristic diagram illustrating IV curves of Samples 3 to 5 together.

As can be seen from FIGS. 13A to 13C, in the switch device 1A (Samples 3 and 4) and the switch device 100 (Sample 5), ovonic threshold switching was seen in which the resistance is radically decreased and the current is increased after reaching a certain threshold voltage, independently of presence or absence of the high resistance layer 32. FIG. 14 illustrates together the IV curves in an increasing direction of the forward-bias application voltage in Samples 3 to 5 illustrated in FIGS. 13A to 13C. Comparing Samples 3 and 4 to Sample 5 in which the high resistance layer 32 was not provided, the leakage current was reduced (almost to zero) in an OFF state (a voltage of 0), and further, the threshold voltage was increased in both of Samples 3 and 4. In other words, it can be seen that the switch device 1A of the embodiment of the present disclosure has favorable characteristics that are comparable to those of a storage device (for example, the storage device 3Y) having a high write threshold voltage. It is to be noted that, when comparing Sample 3 to Sample 4, the threshold voltage was higher and the leakage current was smaller in Sample 4 where SiN was used than in Sample 3 where $SiO_2$ was used. This can be appropriately controlled by setting thicknesses, forming conditions, etc. of $SiO_2$ and SiN.

As described above, the material used for the high resistance layer 32 may be an oxide or may be a nitride. It is to be noted that, although not described in the present Examples, similar effects are achieved when an oxide, a nitride, or an oxynitride of Al, Ga, Mg, Hf, rare-earth elements, or the like is used as the material for the high resistance layer 32, other than the oxide and the nitride of Si.

[Example 3]

Figure 15:
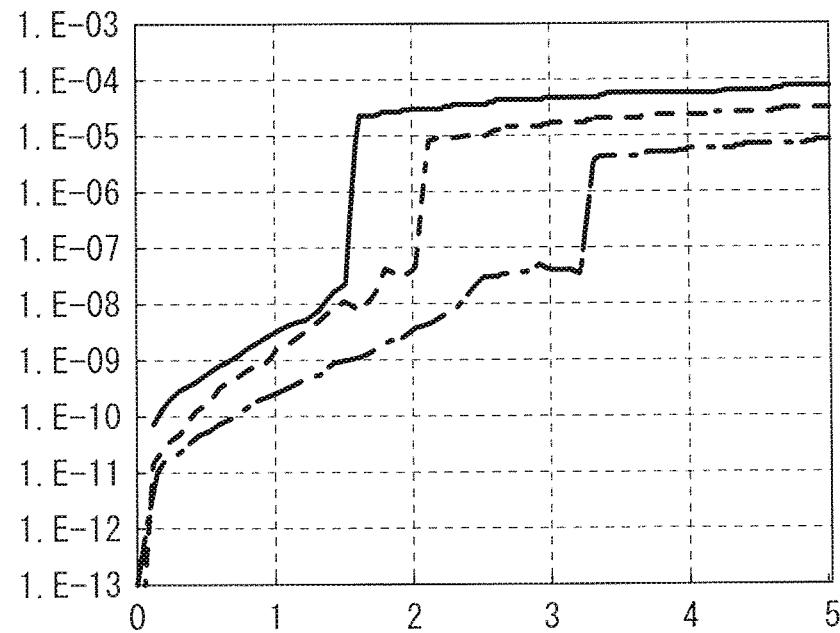
FIG. 15 is an IV characteristic diagram of Experiment 3 of an embodiment of the present disclosure.

Next, using Sample 3, a maximum application voltage was set to be constant at 6 V, and a value of resistance connected in series to the switch device 1A was varied (5 kΩ, 12.5 kΩ, 50 kΩ) to vary a maximum current value. FIG. 15 illustrates IV curves of forward bias for the respective resistance values. It can be seen that the leakage current and the threshold voltage are varied in response to variation in a value of maximum current that passes through the switch device 1A. Next, a relationship between the maximum current to be passed through Sample 3 and the leakage current as well as a relationship between the maximum current and threshold voltage determined based on these measurements were illustrated in FIGS. 16A and 16B. It is to be noted that the definition of the leakage current was set as a forward-bias current of 0.5 V.

Figure 16A:
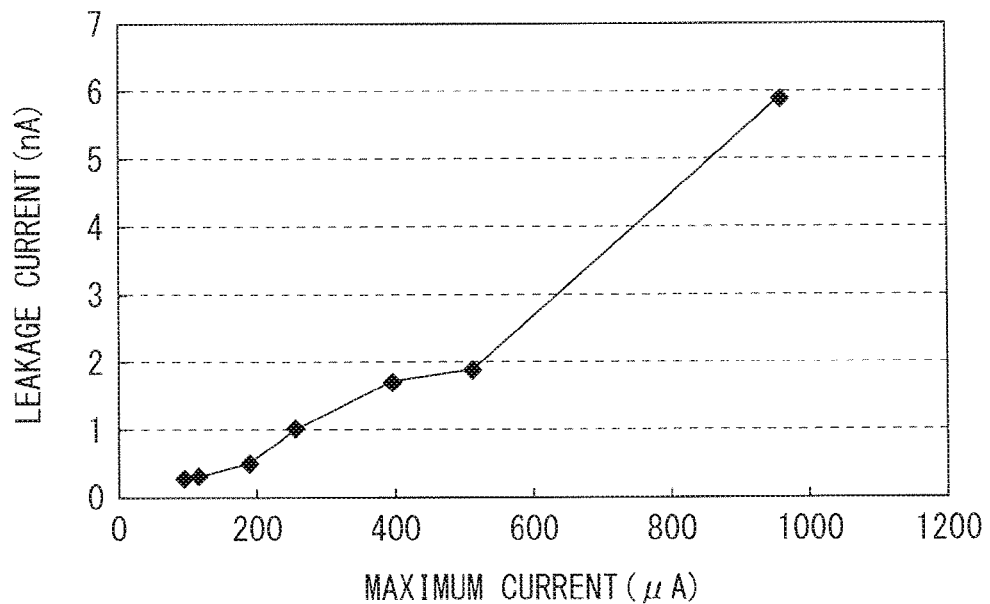
FIG. 16A is a characteristic diagram illustrating a relationship between maximum current and a leakage current in Experiment 3.
Figure 16B:
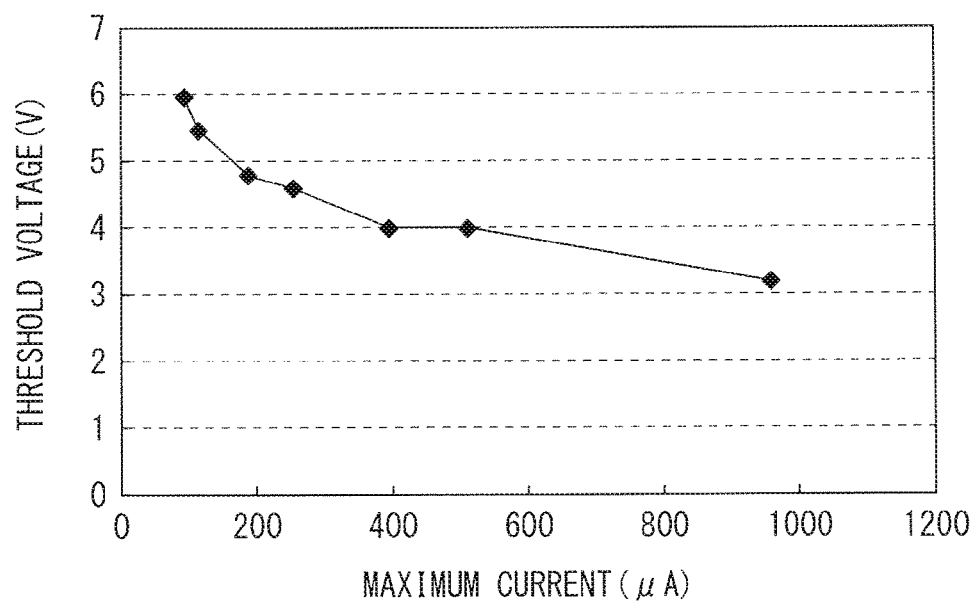
FIG. 16B is a characteristic diagram illustrating a relationship between the maximum current and a switching threshold voltage in Experiment 3.

It can be seen from FIGS. 16A and 16B that, in the switch device 1A of the present embodiment, the leakage current in the OFF state and the threshold voltage are allowed to be controlled depending on the magnitude of the maximum current to be passed. In other words, it is possible to control characteristics of the switch device by performing a forming process under predetermined conditions at the time of the initial voltage application.

Accordingly, it can be seen that the switch device 1A of the present embodiment is capable of increasing the threshold voltage without decreasing the resistance variation ratio, by laminating the high resistance layer 32 in which the resistance is varied at a certain voltage on the OTS layer 31 configured of chalcogenide.

It is to be noted that the effects of the present disclosure are not necessarily limited to the effects described in the embodiment and Examples above, and may be any of the effects described herein.

It is possible to achieve at least the following configurations from the above-described example embodiments and the modifications of the disclosure.

(1) A switch device including:
a first electrode;
a second electrode arranged to face the first electrode; and
a switch layer provided between the first electrode and the second electrode,
the switch layer including
a first layer containing a chalcogen element, and
a second layer containing a high resistance material.
(2) The switch device according to (2), wherein the second layer is provided to be in contact with one or both surfaces of the first layer.
(3) The switch device according to (1) or (2), wherein the first layer contains one or more of oxygen (O), sulfur (S), selenium (Se), and tellurium (Te).
(4) The switch device according to (3), wherein the first layer further contains one or more of germanium (Ge), antimony (Sb), silicon (Si), and arsenic (As).
(5) The switch device according to any one of (1) to (4), wherein the second layer contains one of an oxide of a metal element, a nitride of the metal element, an oxide of a non-metal element, and a nitride of the non-metal element.
(6) The switch device according to (5), wherein the metal element is one or more of aluminum (Al), gallium (Ga), magnesium (Mg), silicon (Si), hafnium (Hf), and rare-earth elements.
(7) The switch device according to any one of (1) to (6), wherein the first layer is varied to be in a low resistance state in response to setting of an application voltage to a predetermined threshold voltage or higher, and the first layer is varied to be in a high resistance state in response to decreasing of the application voltage to a voltage lower than the predetermined threshold voltage.
(8) The switch device according to any one of (1) to (7), wherein the second layer includes a conductive path therein.
(9) The switch device according to any one of (1) to (8), wherein the second layer has a resistance value that is higher than a resistance value of the first layer.
(10) A storage unit including
a plurality of memory cells each including a storage device and a switch device configured to be connected to the storage device,
the switch device including
a first electrode,
a second electrode arranged to face the first electrode and
a switch layer provided between the first electrode and the second electrode,
the switch layer including
a first layer containing a chalcogen element, and
a second layer containing a high resistance material.
(11) The storage unit according to (10), wherein the storage device includes a storage layer between the first electrode and the second electrode of the switch device.
(12) The storage unit according to (11), wherein the storage layer include an ion source layer and a resistance variation layer, the ion source layer containing one or more chalcogen elements selected from tellurium (Te), sulfur (S), and selenium (Se).

(13) The storage unit according to (11) or (12), wherein the storage layer and the switch layer are laminated between the first electrode and the second electrode, and with a third electrode in between.
(14) The storage unit according to (12) or (13), wherein the storage layer and the switch layer are laminated with the second layer in between.
(15) The storage unit according to any one of (12) to (14), wherein the storage layer and the switch layer are laminated with the resistance variation layer in between.
(16) The storage unit according to any one of (12) to (15), wherein the second layer of the switch layer serves as the resistance variation layer of the storage layer.
(17) The storage unit according to any one of (10) to (16), further including:
a plurality of row lines; and
a plurality of column lines, wherein
the plurality of memory cells are provided near respective intersection regions of the plurality of row lines and the plurality of column lines.
(18) The storage unit according to any one of (11) to (17), wherein the storage layer is one of a resistance variation layer, a phase change memory layer, and a magnetoresistive random access memory layer, the resistance variation layer being made of a transition metal oxide.
(19) The storage unit according to any one of (10) to (18), wherein the switch device is an ovonic threshold switch device.
(20) The storage unit according to any one of (10) to (19), wherein the storage device has a write threshold voltage of 1.5 volts or higher.

It should be understood by those skilled in the art that various modifications, combinations, sub-combinations, and alterations may occur depending on design requirements and other factors insofar as they are within the scope of the appended claims or the equivalents thereof.

What is claimed is:
1. A switch device comprising:
a first electrode;
a second electrode arranged to face the first electrode; and
a switch layer provided between the first electrode and the second electrode,
the switch layer including
a first layer containing a chalcogen element, and
a second layer containing a high resistance material,
wherein the second layer includes a first portion in contact with a first surface of the first layer, and a second portion in contact with a second surface of the first layer opposite the first surface, and
wherein the second electrode is in contact with a storage layer including a resistance variation layer and an ion source layer that contains one or more chalcogen elements selected from tellurium (Te), sulfur (S), and selenium (Se).
2. The switch device according to claim 1, wherein the first layer contains one or more of oxygen (O), sulfur (S), selenium (Se), and tellurium (Te).
3. The switch device according to claim 2, wherein the first layer further contains one or more of germanium (Ge), antimony (Sb), silicon (Si), and arsenic (As).
4. The switch device according to claim 1, wherein the second layer contains one of an oxide of a metal element, a nitride of the metal element, an oxide of a non-metal element, and a nitride of the non-metal element.
5. The switch device according to claim 4, wherein the metal element is one or more of aluminum (Al), gallium (Ga), magnesium (Mg), silicon (Si), hafnium (Hf), and rare-earth elements.
6. The switch device according to claim 1, wherein the first layer is varied to be in a low resistance state in response to setting of an application voltage to a predetermined threshold voltage or higher, and the first layer is varied to be in a high resistance state in response to decreasing of the application voltage to a voltage lower than the predetermined threshold voltage.
7. The switch device according to claim 1, wherein the second layer includes a conductive path therein.
8. The switch device according to claim 1, wherein the second layer has a resistance value that is higher than a resistance value of the first layer.
9. A storage unit comprising
a plurality of memory cells each including a first electrode, a second electrode arranged to face the first electrode, a storage device and a switch device configured to be connected to the storage device,
the switch device including
a switch layer provided between the first electrode and the second electrode, the switch layer including
a first layer containing a chalcogen element, and
a second layer containing a high resistance material,
the storage device including a storage layer between the first electrode and the second electrode, and
the storage layer including an ion source layer and a resistance variation layer, wherein the ion source layer contains one or more chalcogen elements selected from tellurium (Te), sulfur (S), and selenium (Se).
10. The storage unit according to claim 9, wherein the storage layer and the switch layer are laminated between the first electrode and the second electrode, and with a third electrode in between.
11. The storage unit according to claim 9, wherein the storage layer and the switch layer are laminated with the second layer in between.
12. The storage unit according to claim 9, wherein the storage layer and the switch layer are laminated with the resistance variation layer in between.
13. The storage unit according to claim 9, wherein the second layer of the switch layer serves as the resistance variation layer of the storage layer.
14. The storage unit according to claim 9, further comprising:
a plurality of row lines; and
a plurality of column lines, wherein
the plurality of memory cells are provided near respective intersection regions of the plurality of row lines and the plurality of column lines.
15. The storage unit according to claim 9, wherein the resistance variation layer is made of a transition metal oxide.
16. The storage unit according to claim 9, wherein the switch device is an ovonic threshold switch device.
17. The storage unit according to claim 9, wherein the storage device has a write threshold voltage of 1.5 volts or higher.
18. The switch device according to claim 1, wherein the storage layer and the switch layer are arranged with the second electrode therebetween.
19. The switch device according to claim 1, wherein the storage layer and the switch layer are arranged between the first electrode and the second electrode.

* * * * *